(12) United States Patent
Lee et al.

(10) Patent No.: US 9,379,134 B2
(45) Date of Patent: Jun. 28, 2016

(54) SEMICONDUCTOR MEMORY DEVICES HAVING INCREASED DISTANCE BETWEEN GATE ELECTRODES AND EPITAXIAL PATTERNS AND METHODS OF FABRICATING THE SAME

(71) Applicants: Joonsuk Lee, Seoul (KR); Woosung Lee, Yongin-si (KR); Woong Lee, Seoul (KR)

(72) Inventors: Joonsuk Lee, Seoul (KR); Woosung Lee, Yongin-si (KR); Woong Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/875,840

(22) Filed: Oct. 6, 2015

(65) Prior Publication Data

US 2016/0126253 A1    May 5, 2016

(30) Foreign Application Priority Data

Nov. 3, 2014  (KR) ......................... 10-2014-0151380

(51) Int. Cl.
*H01L 27/115*   (2006.01)
(52) U.S. Cl.
CPC ............................... *H01L 27/11582* (2013.01)

(58) Field of Classification Search
CPC ................... H01L 27/11556; H01L 27/11582; H01L 29/7889; H01L 29/7926
See application file for complete search history.

(56) References Cited

U.S. PATENT DOCUMENTS

| | | | |
|---|---|---|---|
| 6,521,508 B1 | 2/2003 | Cheong et al. | |
| 6,849,499 B2 | 2/2005 | Sung et al. | |
| 8,592,873 B2 | 11/2013 | Kim et al. | |
| 2009/0026618 A1 | 1/2009 | Kim et al. | |
| 2014/0070302 A1 | 3/2014 | Yoo et al. | |
| 2015/0145020 A1* | 5/2015 | Kim ................... | H01L 27/11582 257/324 |

FOREIGN PATENT DOCUMENTS

| | | |
|---|---|---|
| JP | 2008-141124 A | 6/2008 |
| KR | 10-2010-0053896 | 5/2010 |
| KR | 10-1004806 | 1/2011 |
| KR | 10-2013-0086778 | 8/2013 |

* cited by examiner

*Primary Examiner* — Daniel Shook
(74) *Attorney, Agent, or Firm* — Myers Bigel & Sibley, P.A.

(57) ABSTRACT

A semiconductor memory device is provided including a substrate, a plurality of interlayer insulating layers and gate electrodes alternately stacked on the substrate. The plurality of interlayer insulating layers and the gate electrodes define a channel hole that vertically penetrates the plurality of interlayer insulating layers and the gate electrodes to expose at least a portion of the substrate. A channel recess is provided in the substrate exposed by the channel hole. An epitaxial pattern fills the channel recess. The epitaxial pattern has an upper surface that is concave and curves inward in a middle portion thereof.

20 Claims, 24 Drawing Sheets

SEMICONDUCTOR MEMORY DEVICES HAVING INCREASED DISTANCE BETWEEN GATE ELECTRODES AND EPITAXIAL PATTERNS AND METHODS OF FABRICATING THE SAME

CROSS-REFERENCE TO RELATED APPLICATION

This U.S. non-provisional patent application claims priority to Korean Patent Application No. 10-2014-0151380, filed Nov. 3, 2014, the contents of which are hereby incorporated herein by reference in its entirety.

FIELD

Embodiments of the inventive concepts generally relate to semiconductor memory devices and, more particularly, to three dimensional semiconductor memory devices and methods of fabricating the same.

BACKGROUND

In order to meet increasingly stringent requirements of high performance and cost effectiveness in the field of semiconductor memory devices, it is desirable to increase the integration level of semiconductor memory devices. In particular, the integration level of a semiconductor memory device is an important factor in determining the cost of a product. Since the integration level of a conventional two dimensional (2D) memory device is generally determined by an area occupied by a unit memory cell, it is considerably affected by micro patterning technology used to form the device. However, in order to achieve micro patterning, high-priced-equipment is typically required. Accordingly, attempts to increase the integration level of the conventional 2D memory device are being made continuously.

To overcome the limitation of 2D device structure, 3D semiconductor memory devices including memory cells arranged in a 3D manner have been proposed. However, for mass production of 3D semiconductor memory devices, a technology for achieving reliable products while reducing the cost per bit is desired.

SUMMARY

Some embodiments of the present inventive concept provide a three dimensional semiconductor memory device with improved electric characteristics.

Further embodiments of the inventive concept provide a method of fabricating a three dimensional semiconductor memory device with improved electric characteristics.

It will be understood that technical objectives of the inventive concept are not limited to the above disclosure; other objectives may become apparent to those of ordinary skill in the art based on the following description.

Some embodiments of the inventive concept provide a semiconductor memory device including a substrate, interlayer insulating layers and gate electrodes alternately stacked on the substrate, a channel hole vertically penetrating the interlayer insulating layers and the gate electrodes to expose the substrate, a channel recess formed in the substrate exposed by the channel hole, and an epitaxial pattern filling the channel recess, wherein the epitaxial pattern has an upper surface that is concave curves inward in the middle.

In further embodiments, the upper surface of the epitaxial pattern includes an edge in contact with a sidewall of the channel recess wherein the edge is positioned at a level substantially equivalent to or lower than an upper surface of the substrate.

In still further embodiments, the epitaxial pattern includes the same material as the substrate.

In some embodiments, the epitaxial pattern is doped with impurities of the same conductivity type as the substrate.

In further embodiments, the device further comprises a vertical channel pattern disposed in the channel hole, wherein the vertical channel pattern is electrically connected to the epitaxial pattern.

In still further embodiments, the vertical channel pattern directly contacts the epitaxial pattern.

In some embodiments, a bottom surface of the vertical channel pattern is positioned at a lower level than the upper surface of the substrate.

In further embodiments, the device further comprises a gate dielectric pattern surrounding an outside sidewall of the vertical channel pattern.

In still further embodiments, the gate dielectric pattern has a pipe shape.

In some embodiments, the gate dielectric pattern includes a blocking insulating pattern, a charge trap pattern and a tunnel insulating pattern.

In further embodiments, a bottom surface of the gate dielectric pattern is positioned at a level between the upper surface of the substrate and the bottom surface of the vertical channel pattern. The upper surface of the substrate is positioned at a higher level than the bottom surface of the vertical channel pattern.

In still further embodiments, the device further comprises a filling insulating pattern filling an inside of the vertical channel pattern.

In some embodiments, a horizontal boundary between the filling insulating pattern and the vertical channel pattern is positioned at a lower level than the upper surface of the substrate.

Further embodiments provide a semiconductor memory device including a substrate including an epitaxial pattern, gate electrodes vertically stacked on the substrate, a vertical channel pattern penetrating the gate electrodes and electrically connected to the epitaxial pattern, and a gate dielectric pattern disposed between the vertical channel pattern and the gate electrodes and surrounding a sidewall of the vertical channel pattern, wherein the epitaxial pattern has an upper surface whose center portion is positioned at a lower level than an edge thereof, and wherein the bottom surface of the gate dielectric pattern is positioned at a lower level than an upper surface of the substrate.

In still further embodiments, the epitaxial pattern includes the same material as the substrate.

In some embodiments, the epitaxial pattern is doped with impurities of the same conductivity type as the substrate.

In further embodiments, the gate dielectric pattern includes a blocking insulating pattern, a charge trap pattern and a tunnel insulating pattern.

In still further embodiments, the gate dielectric pattern has a pipe shape.

In some embodiments, the bottom surface of the gate dielectric pattern is positioned at a higher level than a bottom surface of the vertical channel pattern.

Further embodiments of the present inventive concept provide a semiconductor memory device including gate electrodes vertically stacked on the substrate, a vertical channel pattern penetrating the gate electrodes and electrically connected to the epitaxial pattern, and a filling insulating pattern filling an inside of the vertical channel pattern, wherein a horizontal boundary between the vertical channel pattern and the filling insulating pattern is positioned at a lower level than the upper surface of the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 3 through FIG. 6, FIG. 7A through FIG. 10A, FIG. 11, FIG. 12A through FIG. 13A and FIG. 14 through FIG. 15 are cross sections illustrating processing steps in the fabrication of a three dimensional semiconductor memory device according to some embodiments of the inventive concept.

FIG. 7B through FIG. 10B and FIG. 12B through FIG. 13B are enlarged views of 131 through B6 regions in FIG. 7A through 10A and FIG. 12A through FIG. 13A, respectively.

DETAILED DESCRIPTION

Figure 1:
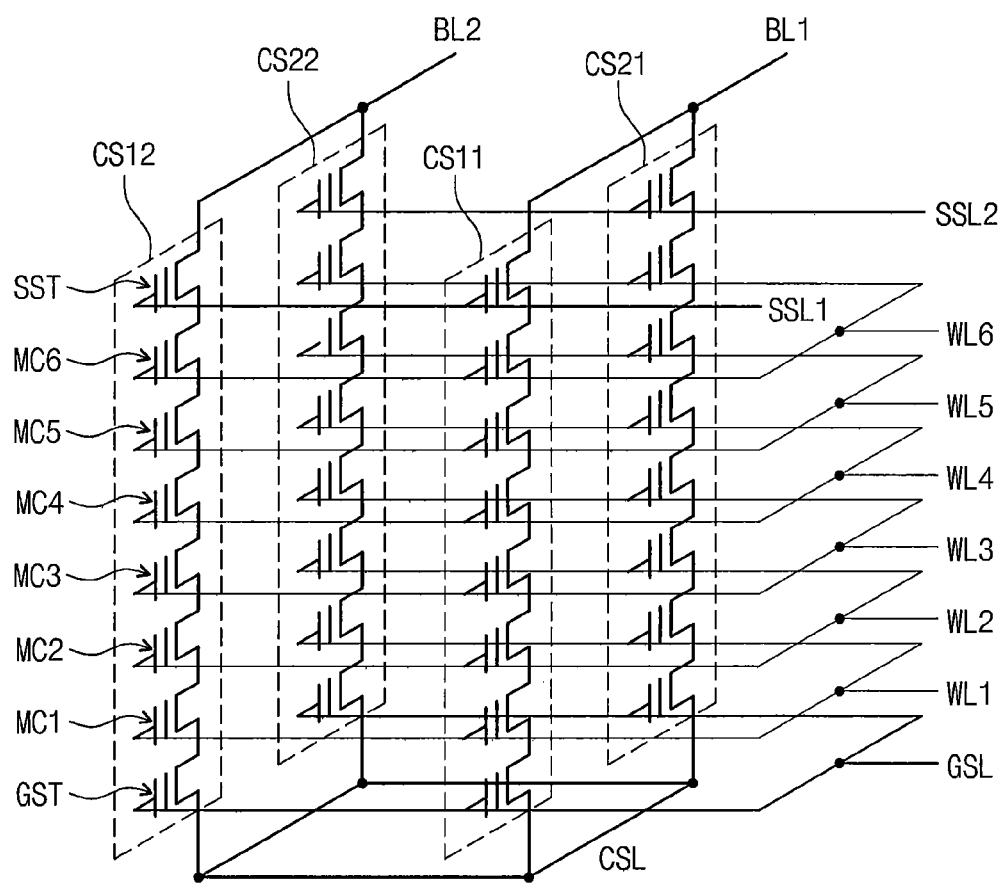
FIG. 1 is a circuit diagram of a cell array of a three dimensional semiconductor memory device according to some embodiments of the inventive concept.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. Rather, example embodiments are provided so that this disclosure is thorough and complete and fully conveys the inventive concept to those skilled in the art.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. In the drawing, the size and relative sizes of layers and regions may be exaggerated for clarity. In the following explanation, the same reference numerals denote the same components throughout the specification.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed blow could be termed a second element, component, region, layer, or section without departing from the teachings of the present inventive concept.

Embodiments are described herein with reference to cross-sectional illustrations that are schematic illustrations of idealized embodiments (and intermediate structure). As such, variations from the shapes of the illustrations as a result, for example, of manufacturing techniques and/or tolerances, are to expect. Thus, embodiments should not be construed as limited to the particular shapes of regions illustrated herein but are to include deviations in shapes that result, for example, from manufacturing.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Unless the context indicates otherwise, terms such as "same," "equal," "planar," or "coplanar," as used herein when referring to orientation, layout, location, shape, size, amount or other measure do not necessarily mean an exactly identical orientation, layout, location, shape, size, amount or other measure, but are intended to encompass nearly identical orientation, layout, location, shape, size, amount or other measure within acceptable variations that may occur, for example, due to manufacturing process. The term "substantially" may be used herein to reflect this meaning.

As used herein, the term "and/or" includes any and all combinations of one or more of the associated listed items.

Referring first to FIG. 1, a circuit diagram of a cell array of a three dimensional semiconductor memory device according to some embodiments of the inventive concept will be discussed. As illustrated in FIG. 1, the memory cell array may include a plurality of cell strings CS11, CS12, CS21 and CS22 extending in a vertical direction.

Each of the cell strings CS11, CS12, CS21 and CS22 may include a ground select transistor GST, a plurality of memory cell transistors MC1, MC2, MC3, MC4, MC5 and MC6 and a string select transistor SST, which are connected to each other in series. In the embodiments illustrated FIG. 1, each of the cell strings CS11, CS12, CS21 and CS22 includes one ground select transistor GST and one string select transistor SST. However, in some embodiments, each of the cell strings CS11, CS12, CS21 and CS22 may include two or more ground select transistors GSTs and string select transistors SSTs, which are connected in series without departing from the scope of the present inventive concept. Furthermore, the cell strings CS11, CS12, CS21 and CS22 each having 6 memory cell transistors MC1, MC2, MC3, MC4, MC5 and MC6 are illustrated, but may have eight or more memory cell transistors MCx.

A plurality of cell strings CS11, CS12, CS21 and CS22 may be connected to a column and row basis. The string select transistor SST of each of the cell strings CS11, CS12, CS21 and CS22 may be connected to corresponding bit lines BL1 and BL2. For example, the cell strings CS11 and CS21 commonly connected to the first bit line BL1 may form a first column, and the cell strings CS12 and CS22 commonly connected to the second bit line BL2 may form a second column. In addition, the string select transistor SST of each of the cell strings CS11, CS12, CS21 and CS22 may be connected to string select lines SSL1 and SSL2. For example, the cell strings CS11 and CS12 commonly connected to the first string select line SSL1 may form a first low, and the cell strings CS21 and CS22 commonly connected to the second string select line SSL2 may form a second low.

The ground select transistor GST of each of the cell strings CS11, CS12, CS21 and CS22 may be connected to a ground select line GSL. A common source line CSL may be connected to the ground select transistor GST of each of the cell strings CS11, CS12, CS21 and CS22.

The memory cell transistors MC1, MC2, MC3, MC4, MC5 and MC6 positioned at the same height may be connected to the same word lines WL1, WL2, WL3, WL4, WL5 and WL6, respectively. For example, a first memory cell transistor MC 1 connected to the ground select transistor GST may be connected to the first memory cell transistor MC 1 of a column adjacent thereto through a first word line WL1.

The common source line CSL may be commonly connected to sources of the ground select transistor GST. In addition, the ground select line GSL, a plurality of word lines WL1, WL2, WL3, WL4, WL5 and WL6 and the string select line SSL disposed between the common source line CSL and the bit lines BL1 and BL2 may be used as gate electrodes of the ground select transistor GST, the memory cell transistors MC1, MC2, MC3, MC4, MC5 and MC6 and the string select transistor SST, respectively. Each of the memory cell transistors MC1, MC2, MC3, MC4, MC5 and MC6 may include a data storage element.

Figure 2A:
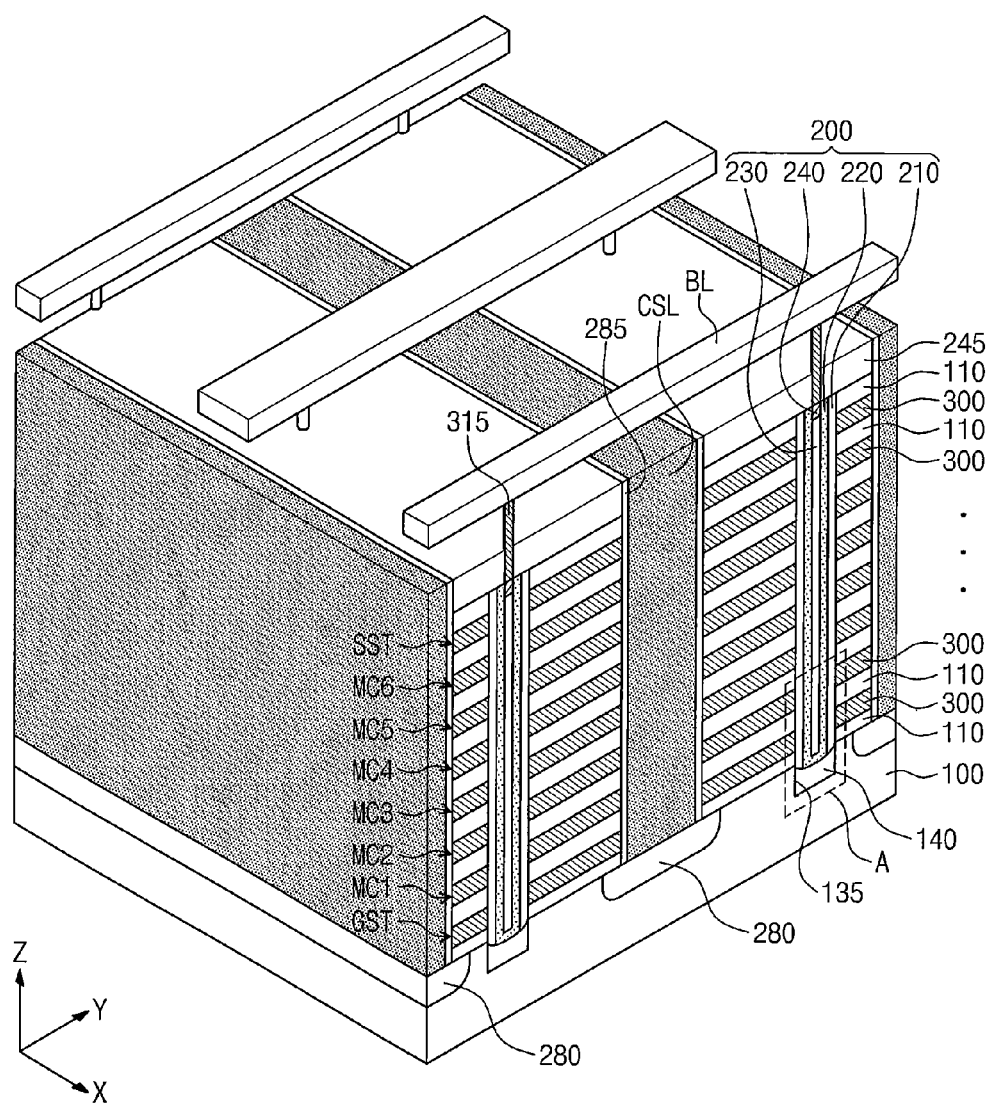
FIG. 2A is a perspective view of a three dimensional semiconductor memory device according to some embodiments of the inventive concept.
Figure 2B:
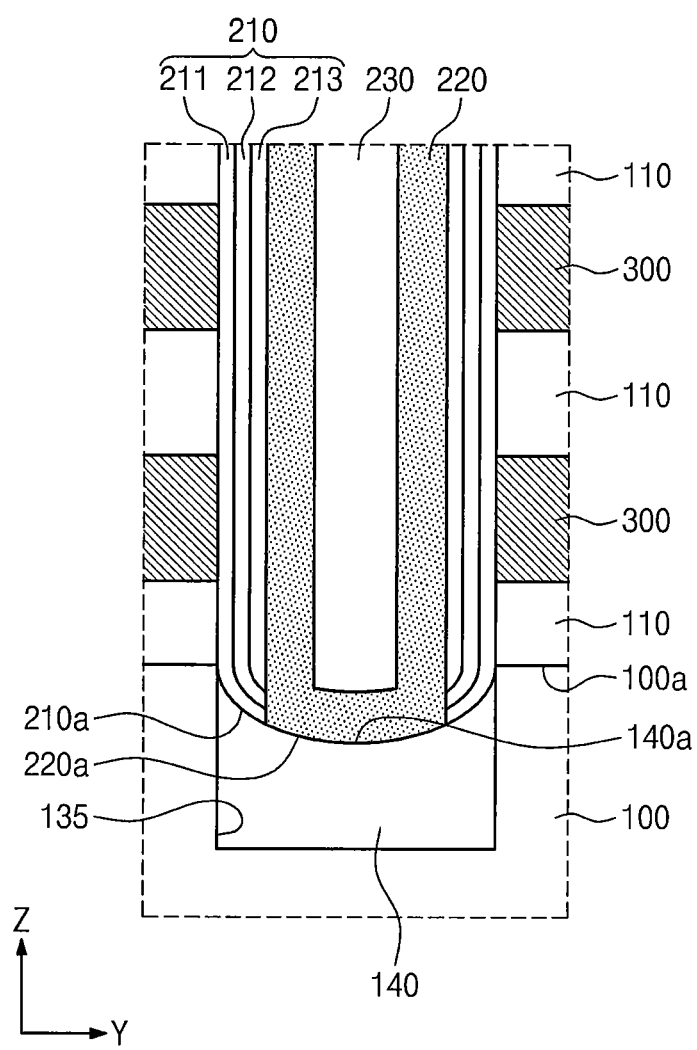
FIG. 2B is an enlarged view of A region in FIG. 2A.

FIG. 2A is a perspective view of a three dimensional semiconductor memory device according to some embodiments of the inventive concept. FIG. 2B is an enlarged view of A region in FIG. 2A.

In the figures cited in this specification, a direction substantially vertical to the surface of the substrate is referred to as a Z direction, and two directions substantially parallel to the upper surface of the substrate and crossing each other are referred to as an X direction and a Y direction. For example, the X and Y directions may be perpendicular to each other. Additionally, a direction indicated by an arrow in the figure and a reverse direction thereof are considered as the same direction.

Referring to FIGS. 2A and 2B, a three dimensional semiconductor memory device according to some embodiments of the inventive concept may include an epitaxial pattern 140, a vertical channel structure 200, gate electrodes 300 and interlayer insulating layers 110 disposed on a substrate 100. The three dimensional semiconductor memory device may further include a common source line CSL and a common source region 280. The three dimensional semiconductor memory device may further include a first capping insulating layer 245 covering the uppermost interlayer insulating layer 110 and the vertical channel structure 200, and a second capping insulating layer (not shown) covering the common source line CSL. The three dimensional semiconductor memory device may further include a bit line contact 315 and a bit line BL.

The substrate 100 may include a bulk silicon wafer, a germanium substrate, a silicon-germanium substrate or a silicon on insulator (SOI).

The epitaxial pattern 140 may fill a channel recess 135 formed in the substrate 100. The epitaxial pattern 140 may have an upper surface 140a that is concave curved inward in the middle. The upper surface 140a of the epitaxial pattern 140 may include a center portion and an edge, and the center portion may be positioned at a lower level than the edge. The upper surface 140a of the epitaxial pattern 140 may include the edge positioned at a level substantially equivalent to or lower than an upper surface 100a of the substrate 100. The epitaxial pattern 140 may include single crystalline silicon or silicon-germanium compound. The epitaxial pattern 140 may have the same conductivity type as the substrate 100.

The vertical channel structure 200 may include a gate dielectric pattern 210, a vertical channel pattern 220, a filling insulating pattern 230 and a channel pad 240.

The vertical channel pattern 220 having a cylindrical shape on the epitaxial pattern 140 may protrude to extend in the Z direction. A bottom surface 220a of the vertical channel pattern 220 may be in direct contact with the epitaxial pattern 140. Accordingly, the vertical channel pattern 220 may be electrically connected to the substrate 100 through the epitaxial pattern 140. The vertical channel pattern 220 may include single crystalline silicon, polycrystalline silicon or amorphous silicon. The bottom surface 220a of the vertical channel pattern 220 is positioned at a lower level than the upper surface 100a of the substrate 100.

The filling insulating pattern 230 may fill the inside of the vertical channel pattern 220. A boundary between the filling insulating pattern 230 and the vertical channel pattern 220 may include the horizontal and vertical boundary. The horizontal boundary may be positioned at a level substantially equivalent to or lower than the upper surface 100a of the substrate 100. The filling insulating pattern 230 may include an insulating material such as silicon oxide, silicon oxynitride or silicon nitride.

The gate dielectric pattern 210 may surround an outside sidewall of the vertical channel pattern 220 and have a pipe shape having an open bottom portion. A bottom surface 210a of the gate dielectric pattern 210 may be disposed between the edge of the epitaxial pattern 140 and the vertical channel pattern 220, and may be in contact with the upper surface 140a of epitaxial pattern 140. The bottom surface 210a of the gate dielectric pattern 210 may be positioned at a lower level than the upper surface 100a of the substrate 100 and may be positioned at a higher level than the bottom surface 220a of the vertical channel pattern 220.

The gate dielectric pattern 210 may include a blocking insulating pattern 211, a charge trap pattern 212 and a tunnel insulating pattern 213. The blocking insulating pattern 211 may be disposed on a sidewall of the interlayer insulating layers 110 and the gate electrodes 300. The blocking insulating pattern 211 may include an oxide such as silicon oxide. The charge trap pattern 212 may be disposed between the blocking insulating pattern 211 and the tunnel insulating pattern 213. The charge trap pattern 212 may include a nitride such as silicon nitride. The tunnel insulating pattern 213 may be disposed between the vertical channel pattern 220 and the charge trap pattern 212, and may surround the sidewall of the vertical channel pattern 220. The tunnel insulating pattern 213 may include silicon oxide and silicon oxynitride.

The channel pad 240 may be disposed on the filling insulating pattern 230. The channel pad 240 may be in direct contact with an upper sidewall of the vertical channel pattern 220, and electrically connected thereto.

The gate electrodes 300 and the interlayer insulating layers 110 may be surround the sidewall of the vertical channel structure 200 and extend in an X direction. The string select transistor SST may be disposed at an intersection of the gate electrode 300 disposed on uppermost portion and the vertical channel structure 200. The ground select transistor GST may be disposed at an intersection of the gate electrode 300 disposed on the lowermost portion and the vertical channel structure 200. The memory cell transistors MCx may be disposed between the string select transistor SST and the ground select transistor GST. The gate electrodes 300 may be electrically insulated by the interlayer insulating layers 110 from each other. The gate electrodes 300 may include at least one of ground select gate electrodes; a plurality of memory cell gate electrodes and at least one of string select gate electrodes. The ground select gate electrode may be disposed on the lowermost portion, and the string select gate electrode may be disposed on the uppermost portion. The memory cell gate electrodes may be stacked between the ground select gate electrode and the string select gate electrode. The memory cell gate electrodes may substantially have the same thickness. The ground select gate electrode and the string select gate electrode may have a thickness that is different than the thickness of the memory cell gate electrodes. For example, the ground select gate electrode and the string select gate electrode may be thicker than the memory cell gate electrodes. According to some embodiments, the memory cell gate electrodes may serve as word lines (WL1, WL2, WL3, WL4, WL5, and WL6 of FIG. 1). The ground select gate electrodes may serve as the ground select line (GSL of FIG. 1) and the string select gate electrode may serve as the string select lines (SSL1 and SSL2 of FIG. 1). The gate electrodes 300 may include a barrier metal layer and a metal layer, respectively. The barrier metal layer may include a metal nitride material such as titanium, titanium nitride, tantalum, and/or tantalum nitride. The metal layer may include tungsten, titanium, tantalum, platinum and/or a metal silicide.

The interlayer insulating layers 110 the gate electrodes 300 may be alternately stacked. The interlayer insulating layer 110 disposed on the lowermost portion may have a thickness thinner than other interlayer insulating layers 110. The interlayer insulating layer 110 may include an insulating material such as silicon oxide.

The common source line CSL may be disposed between the vertical channel structures 200, and vertically penetrate the gate electrodes 300 and the interlayer insulating layers 110. The common source line CSL may be in contact with the substrate 100. The common source line CSL may extend along the X direction. A trench spacer 285 may be disposed between the common source line CSL and the gate electrodes 300, and the common source line. CSL may be electrically insulated from gate electrodes 300 by the trench spacer 285.

The common source region 280 may be formed in the substrate 100 to align with the common source line CSL. The common source region 280 may include N-type impurity such as phosphors or arsenic injected in the substrate 100.

The first capping insulating layer 245 may be disposed on the vertical channel pattern 220 and the channel pad 240. The first capping insulating layer 245 may include silicon oxide. The second capping insulating layer (not shown) may be disposed on the common source line CSL and the first capping insulating layer 245. The second capping insulating layer may include silicon oxide.

The bit line contact 315 may be in contact with the channel pad 240 through the first capping insulating layer 245 and the second capping insulating layer. The bit line contact 315 may include a conductor such as silicon, metal silicide, metal. The bit line BL may be disposed on the second capping insulating layer to extend in a Y direction. The bit line BL may be electrically connected to the vertical channel pattern 220 through the bit line contact 315 and the channel pad 240. The bit line 13L may include a metal such as tungsten or copper.

According to some embodiments of the inventive concept, the three dimensional semiconductor memory device may include the epitaxial pattern 140 having the upper surface 140a that is concave curves inward in the middle. The edge of the epitaxial pattern 140 may be positioned at a higher level than the center portion thereof. The edge of the epitaxial pattern may be positioned at a level substantially equivalent to or lower than the upper surface 100a of the substrate 100. Accordingly, a distance between the gate electrode 300 disposed the lowermost portion and the epitaxial pattern 140 may be increased, and it is possible to prevent a leakage current between the gate electrode 300 disposed the lowermost portion and the substrate 100 through the epitaxial pattern 140. As a result, electrical characteristics may be improved along with device reliability.

FIG. 3 through FIG. 6, FIG. 7A through FIG. 10A, FIG. 11, FIG. 12A through FIG. 13A and FIG. 14 through FIG. 15 are cross sections illustrating processing steps in the fabrication of a three dimensional semiconductor device according to some embodiments of the inventive concept. FIG. 7B through FIG. 10B and FIG. 12B through FIG. 13B are enlarged views of B1 through B6 regions in FIG. 7A through FIG. 10A and FIG. 12B through FIG. 13A, respectively.

Figure 3:
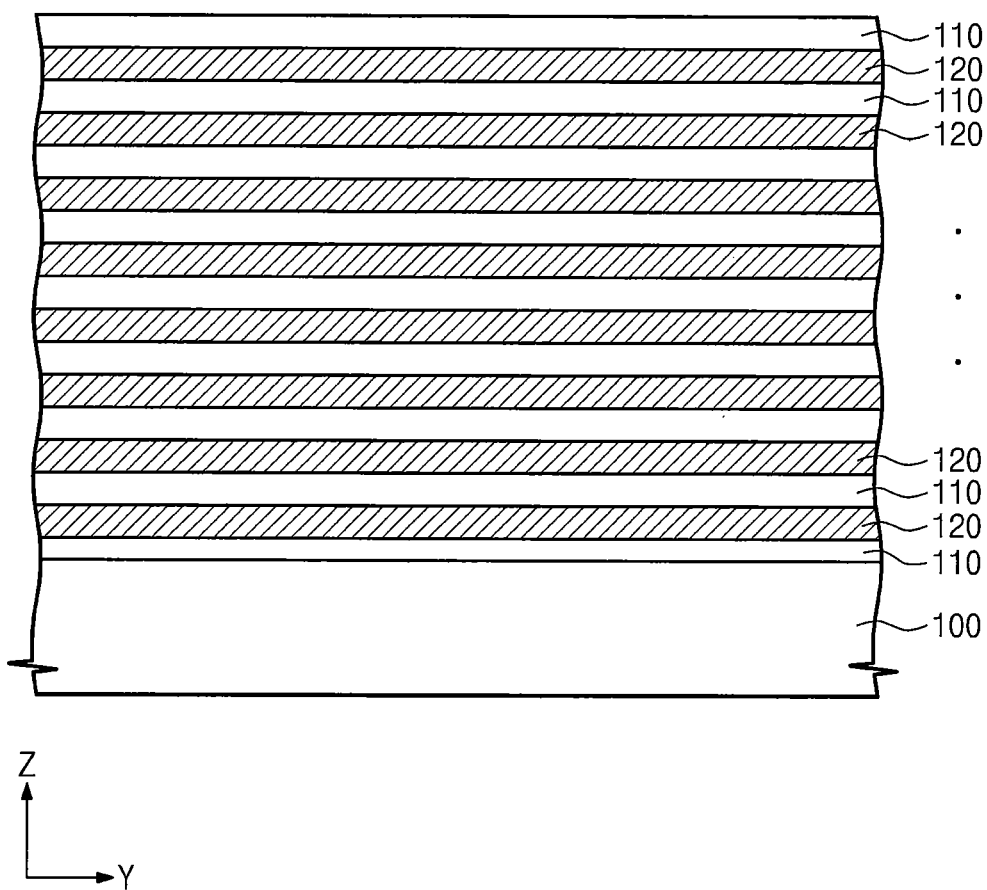

Referring to FIG. 3, a plurality of interlayer insulating layers 110 and a plurality of sacrificial layers 120 may be alternately stacked in on a substrate 100 in a Z direction. The substrate 100 may be doped to have the first conductivity type (for example, p-type).

The interlayer insulating layers 110 may have different thicknesses. For example, the interlayer insulating layer 110 disposed on the lowermost portion may have a thickness thinner than other interlayer insulating layers 110. The interlayer insulating layer 110 may include an insulating material such as silicon oxide.

The sacrificial layers 120 may include a material having an etch selectivity to the interlayer insulating layer 110. For example, the sacrificial layers 120 may include an insulating material such as silicon nitride. The sacrificial layers 120 may have different thicknesses.

Figure 4:
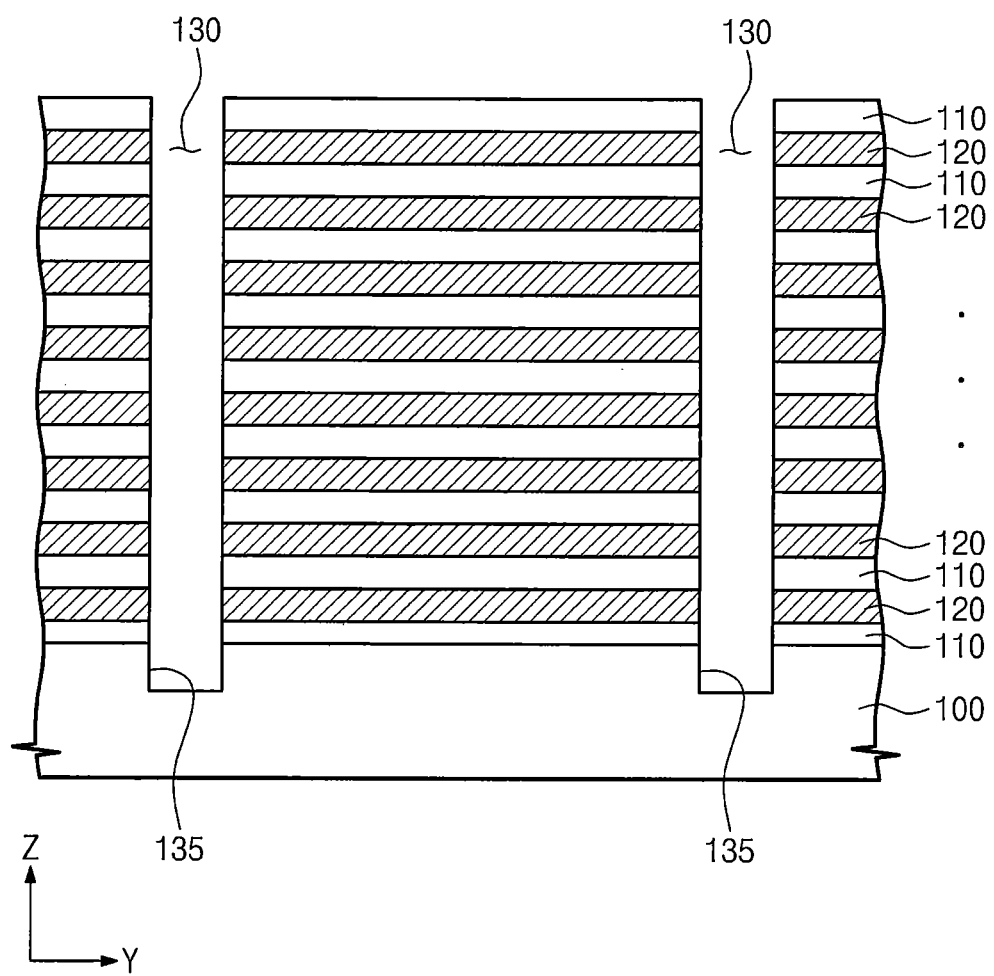

Referring to FIG. 4, channel holes 130 may be formed to expose the substrate 100 through the interlayer insulating layers 110 and the sacrificial layers 120. For example, forming the channel holes 130 may include forming a mask pattern (not shown) on the uppermost interlayer insulating layer 110, and sequentially anisotropically etching the interlayer insulating layers 110 and the sacrificial layers 120 using the mask pattern as an etch mask until an upper surface of the substrate 100 is exposed. Through the anisotropic etching, the surface of the substrate 100 in the channel hole 130 may be over-etched to be recessed to a predetermined depth. Accordingly, a channel recess 135 may be formed below the channel hole 130 by removing a portion of substrate 100 exposed by the channel hole 130. The channel recess 135 may be formed in the substrate 100 by using the anisotropic etching.

Referring to FIG. 4 together with FIG. 2A, the channel holes 130 may be formed in zigzag configuration in an X direction.

Figure 5:
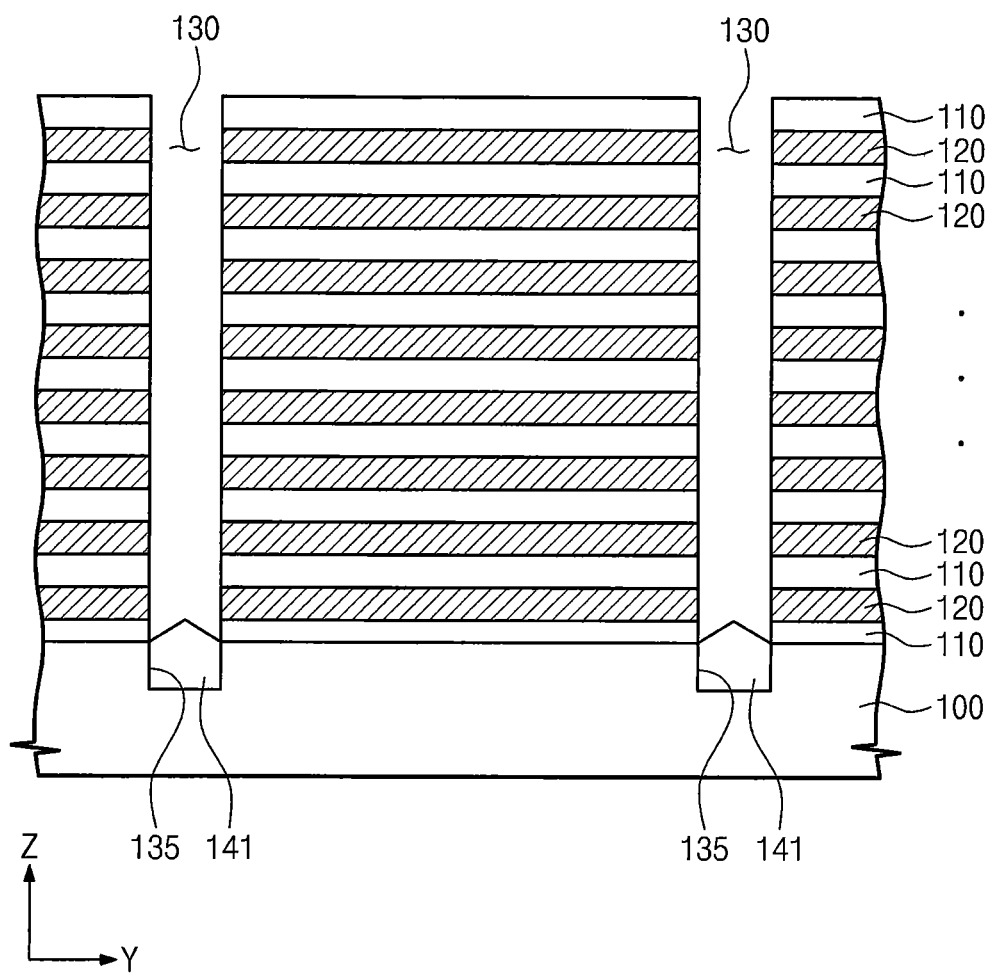

Referring to FIG. 5, an epitaxial layer 141 may be formed to fill the channel recess 135. For example, the formation of the epitaxial layer 141 includes supplying a reaction gas, in which a silicon source gas (for example, containing at least one of $SiCl_4$, $SiH_4$, $SiH_2Cl_2$, $Si_2H_6$, $Si_3H_8$, $SiH_3Cl$, or $SiHCl_3$) and a hydrogen gas are mixed, onto the substrate 100 at a temperature of about 1000° C. Silicon atoms in the reaction gas are decomposed through chemical reaction (for example, SiCl$_4$+2H$_2$⇌4HCl) and deposited on a surface of the substrate 100 exposed by the channel recess 135 to form the epitaxial layer 141. The formation of epitaxial layer 141 can include at least one silicon depositing step and at least one HCl etching step. The epitaxial layer 141 may have the same or a similar crystalline structure to the substrate 100. The epitaxial layer 141 may include single crystalline silicon. A dopant gas (for example, B$_2$H$_6$) can be further supplied during the formation of the epitaxial layer 141, and thus, the epitaxial layer 141 can have the same conductivity type (for example, p-type) as the substrate 100. The dopant gas can be supplied along with the silicon source gas to form the doped epitaxial layer 141. In other embodiments, the dopant gas may be supplied after the formation of epitaxial layer 141. The epitaxial layer 141 may be formed by one of various epitaxial techniques (for example, a vapor phase epitaxy, a liquid phase epitaxy, a molecular beam epitaxy, or a solid phase epitaxy).

A growth speed of silicon can be greater on the substrate 100 exposed in the channel recess 135 than on the interlayer insulating layer 110. As a result, the epitaxial layer 141 may be locally formed within the channel recess. The epitaxial layer 141 may be grown from both of a side and a bottom surface of the channel recess 135. In these embodiments, an upper surface of the epitaxial layer 141 may not be flat. As shown FIG. 5, a center portion of the epitaxial layer 141 may protrude upward from the upper surface 100a of the substrate 100. Accordingly, the center portion of the epitaxial layer 141 may be close to the lowermost layer of the sacrificial layers 120. In a subsequent process, the sacrificial layers 120 may be replaced by gate electrodes 300. When the gate electrode 300 disposed on the lowermost portion is close to the center portion of the epitaxial layer 141, a leakage current between the lowermost gate electrode 300 and the substrate 100 can be generated or increased. Since the leakage current is dependent on a spacing between the gate electrode 300 and the epitaxial layer 141, the appropriate spacing is required for suppressing or reducing the leakage current.

Figure 6:
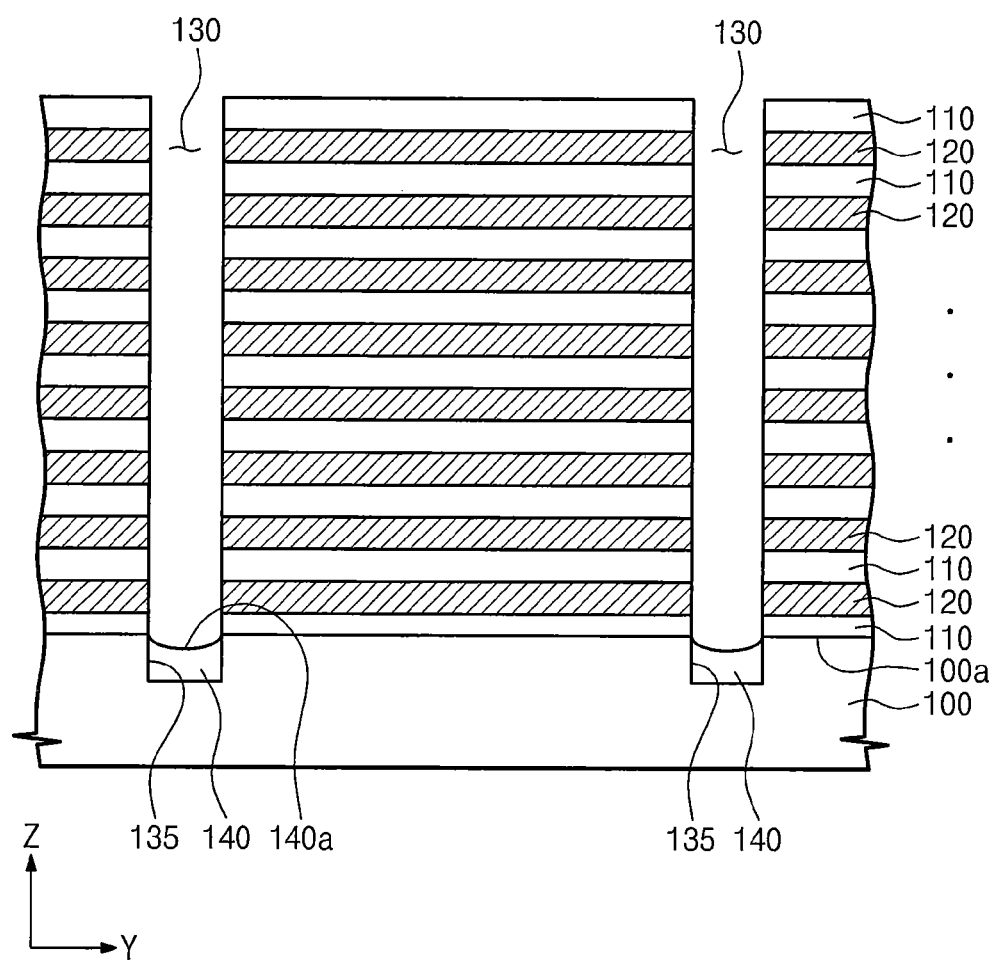

Referring to FIG. 6, the epitaxial pattern 140 may be formed by etching an upper portion of the epitaxial layer 141 protruded upward from the upper surface 100a of the substrate 100. In order to perform an etching process, an etching gas (for example: HCl) may be further supplied in situ after the formation of the epitaxial layer 141. A center portion of the epitaxial layer 141 can be etched faster than an edge thereof during the etching process. As a result, the epitaxial pattern 140 may be formed to have an upper surface 140a that is concave curved inward in the middle. Accordingly, the epitaxial pattern 140 may have the upper surface whose center portion is positioned at a lower level than an edge thereof. The epitaxial pattern 140 may include the edge positioned at a level substantially equivalent to or lower than an upper surface 100a of the substrate 100. The epitaxial pattern 140 may include single crystalline silicon or silicon-germanium compound. The epitaxial pattern 140 may have the same conductivity type as the substrate 100.

Figure 7A:
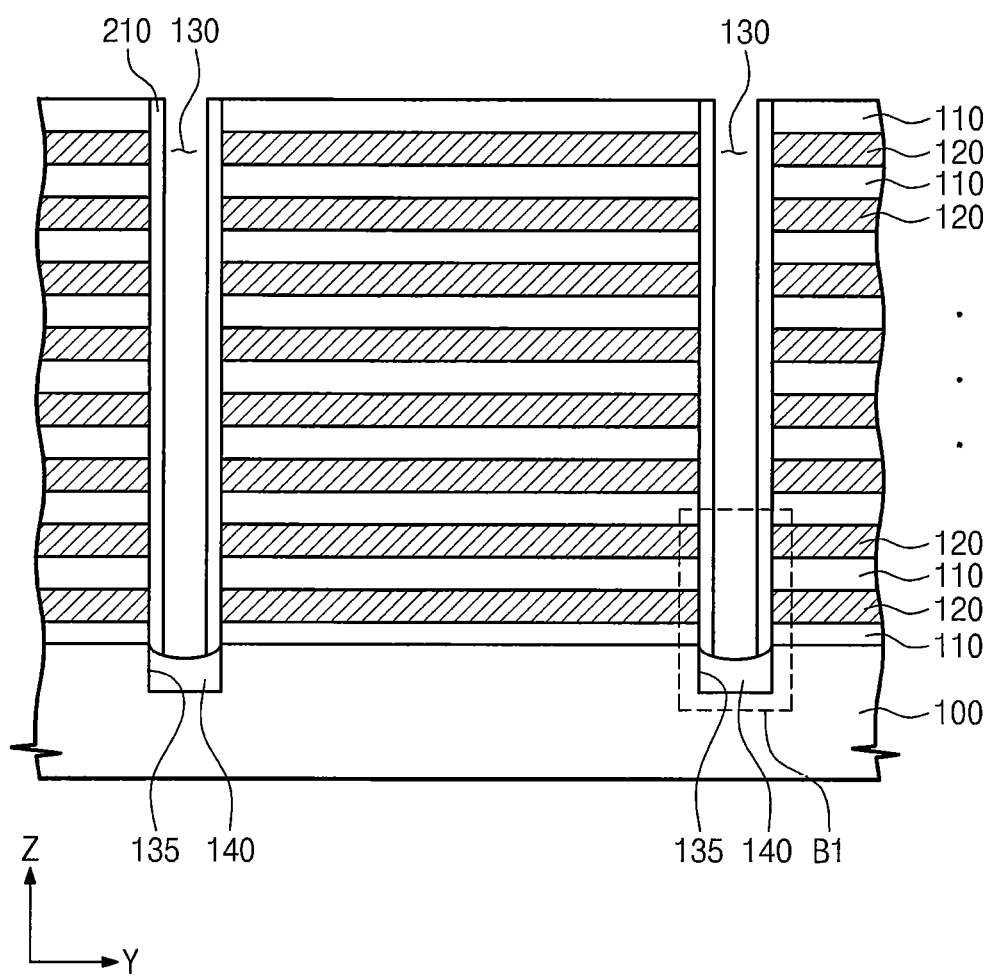
Figure 7B:
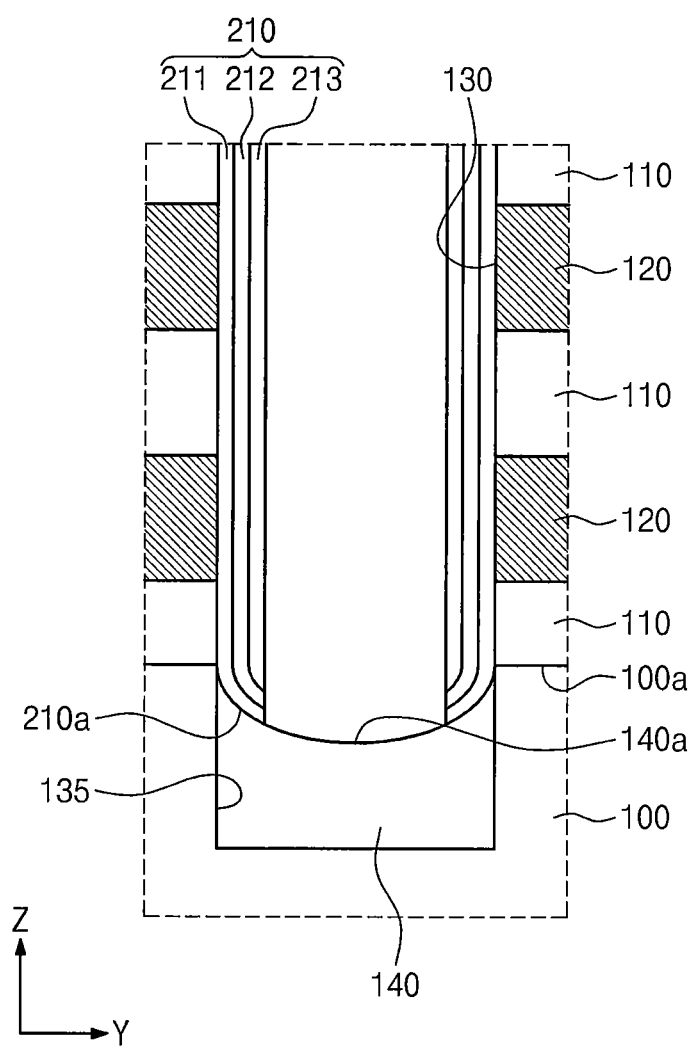

Referring to FIGS. 7A and FIG. 7B, a gate dielectric pattern 210 may be formed on an inner sidewall of the channel hole 130 and a portion of the epitaxial pattern 140. The forming of the gate dielectric pattern 210 may include sequentially forming a blocking insulating layer, a charge trap layer and a tunnel insulating layer on the inner sidewall of the channel hole 130, the uppermost interlayer insulating layer 110 and the epitaxial pattern 140, and exposing the upper surface of the uppermost interlayer insulating layer 110 and the upper surface 140a of the epitaxial pattern 140 by anisotropically etching the blocking insulating layer, the charge trap layer and the tunnel insulating layer. The gate dielectric pattern 210 may be formed as a spacer shape on the sidewall of the channel hole 130 by performing the etching process. The exposed upper surface 140a of the epitaxial pattern 140 may be recessed by the over-etching. The gate dielectric pattern 210 may be formed as a pipe shape in the channel hole 130. The gate dielectric pattern 210 may include a blocking insulating pattern 211, a charge trap pattern 212 and a tunnel insulating pattern 213. The blocking insulating pattern 211, the charge trap pattern 212 and the tunnel insulating pattern 213 may be sequentially formed on the sidewall of the channel hole 130. A horizontal thickness of the gate dielectric pattern 210 may be equivalent to or less than a vertical thickness of the lowermost layer of the interlayer insulating layers 110.

The blocking insulating pattern 211 may include silicon oxide formed by a chemical mechanical deposition process. The charge trap pattern 212 may include a nitride material such as silicon nitride formed by using the chemical mechanical deposition process. The tunnel insulating pattern 213 may include silicon oxide or silicon oxynitride by the chemical mechanical deposition.

Figure 8A:
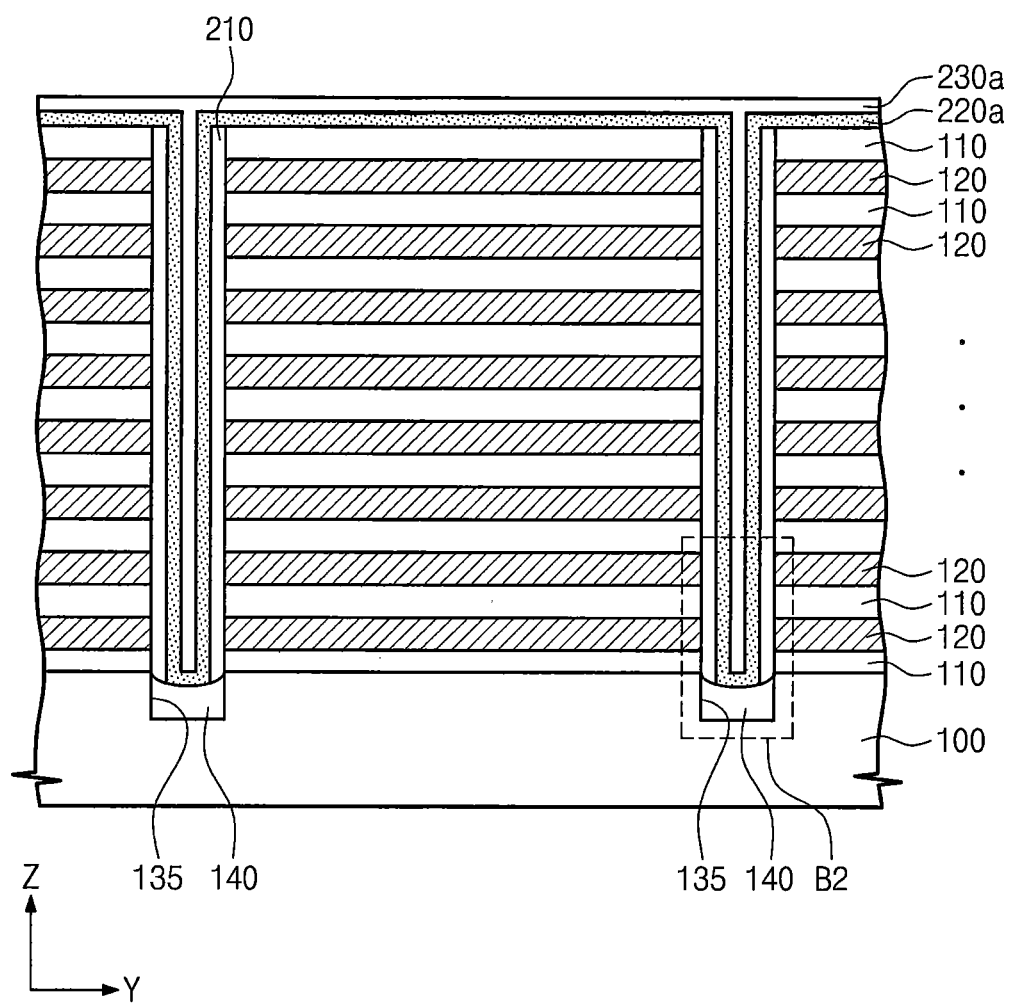
Figure 8B:
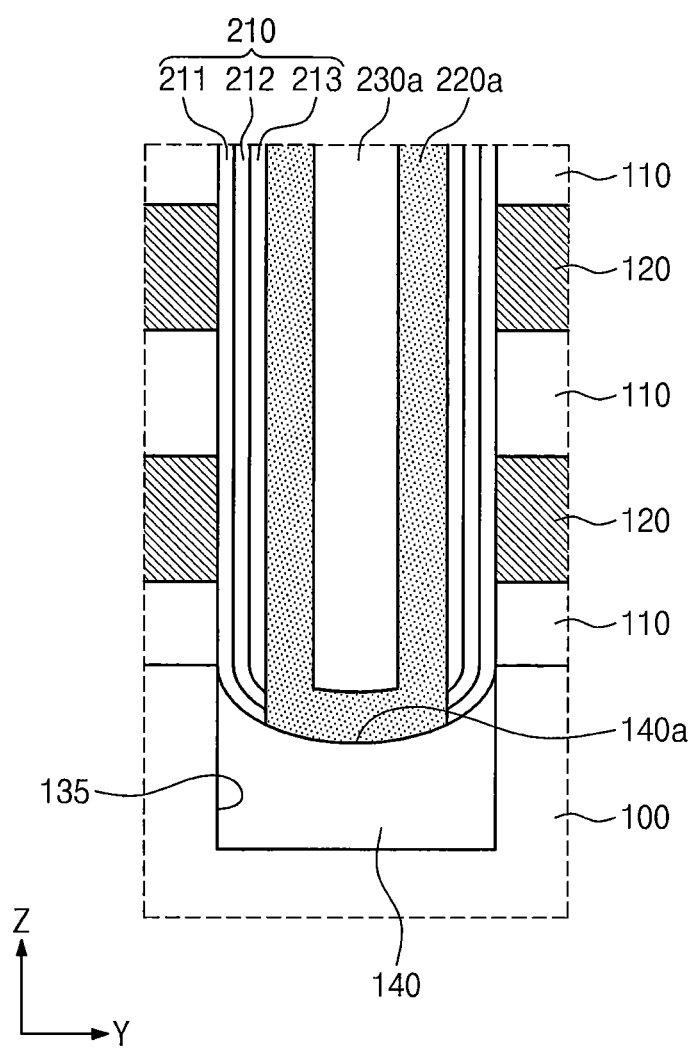

Referring to FIGS. 8A and 8B, a vertical channel layer 220a and a filling insulating layer 230a may be formed in the channel hole 130. The vertical channel layer 220a may be formed on the uppermost interlayer insulating layer 110, the gate dielectric pattern 210 and the exposed epitaxial pattern 140. The vertical channel layer 220a may contact the tunnel insulating pattern 213. The vertical channel layer 220a may be in direct contact with the upper surface 140a of the epitaxial pattern 140 and electrically connected to the substrate 100. The vertical channel layer 220a may include single crystalline silicon, polycrystalline silicon and amorphous silicon by the chemical mechanical deposition or an atomic layer deposition. The filling insulating layer 230a may be formed on the vertical channel layer 220a to fully fill an inside of the channel hole 130. The filling insulating layer 230a may include silicon oxide.

Figure 9A:
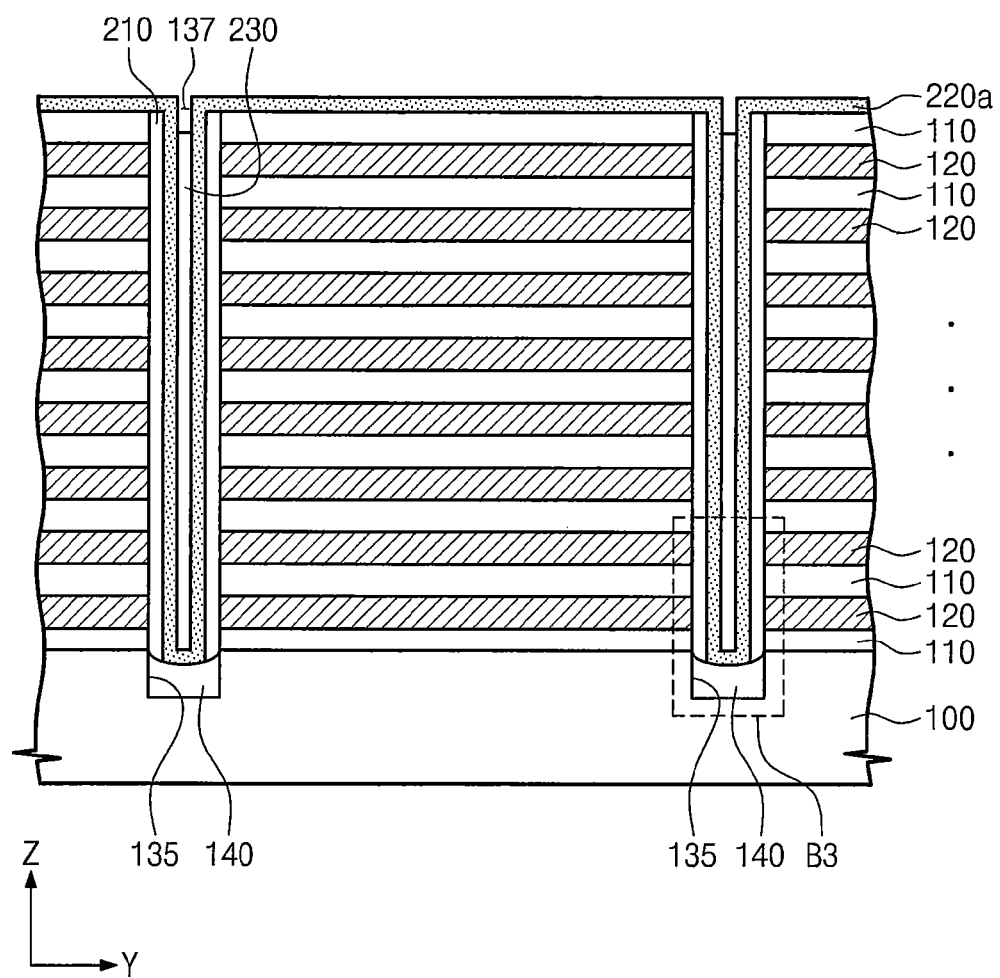
Figure 9B:
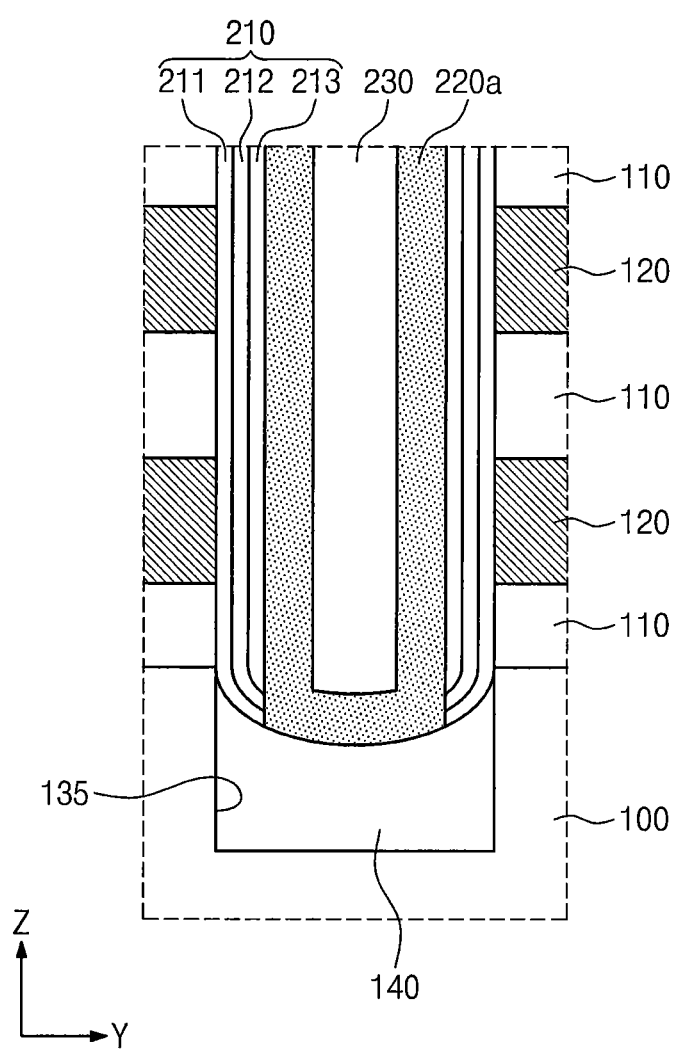

Referring to FIGS. 9A and 9B, a filling insulating pattern 230 having a pad recess 137 may be formed by performing an etch-back process on the filling insulating layer 230a. The vertical channel layer 220a may be exposed on the uppermost interlayer insulating layer 110. An upper surface of the filling insulating pattern 230 may be positioned at level lower than an upper surface of the uppermost interlayer insulating layer 110

Figure 10A:
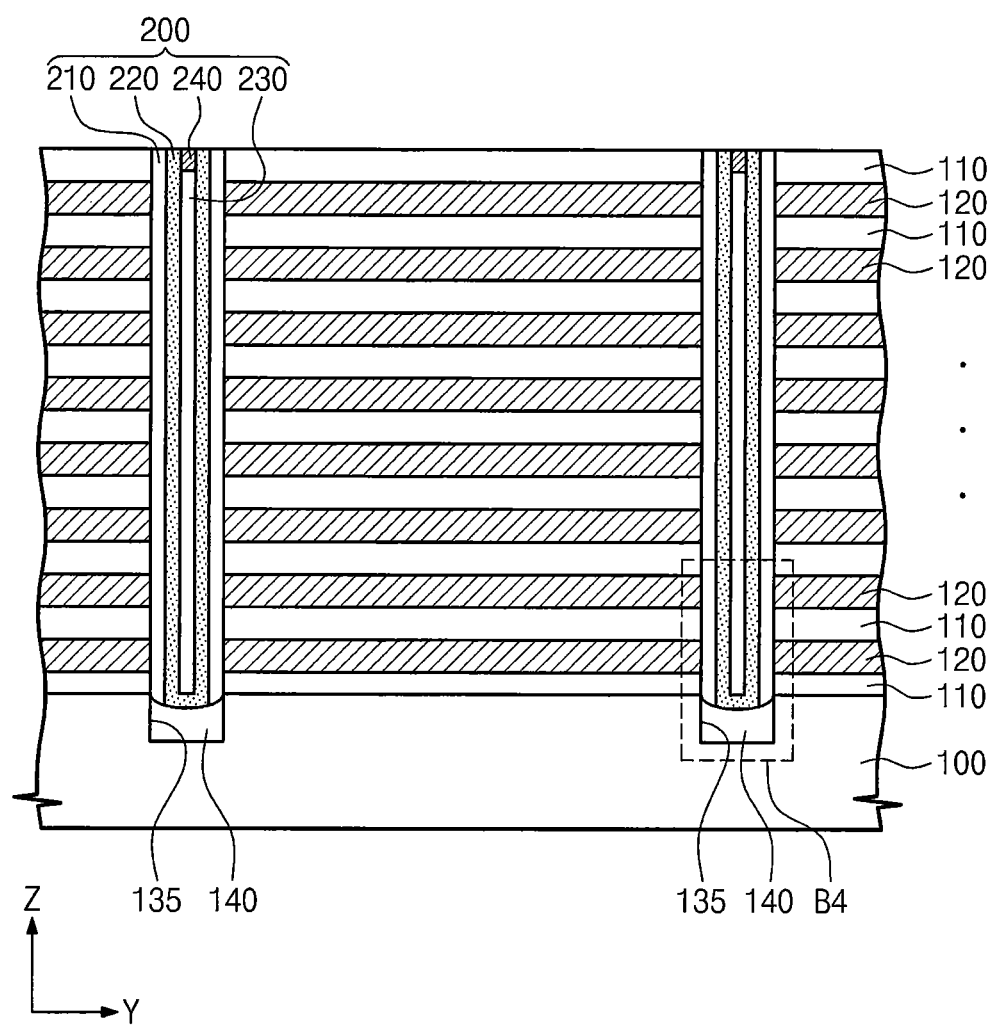
Figure 10B:
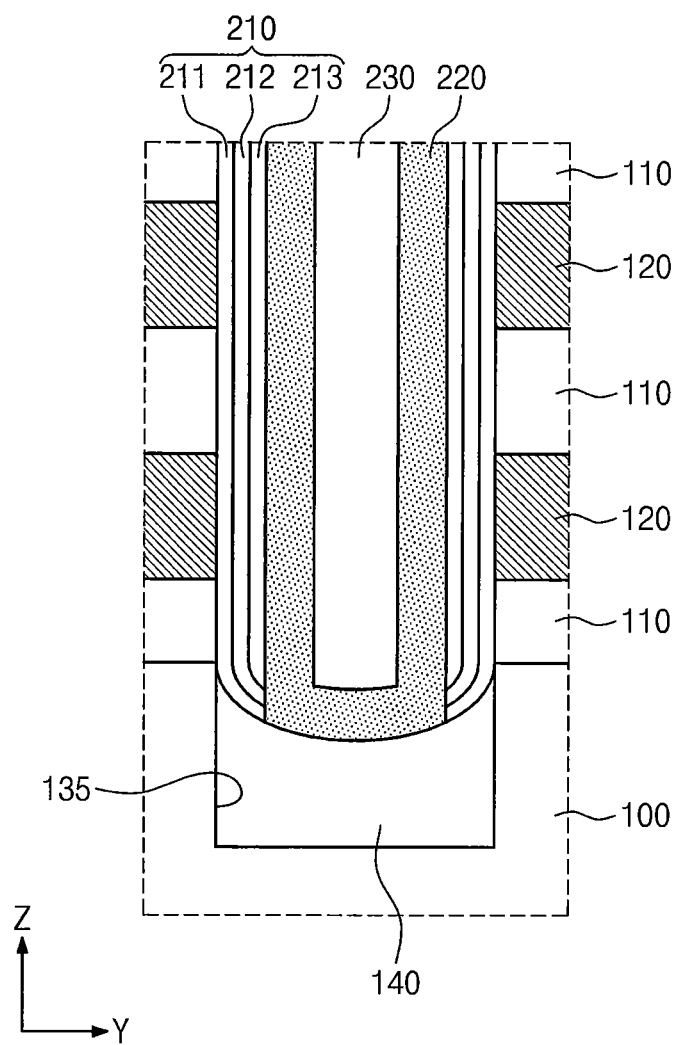

Referring to FIGS. 10A and 1013, a pad material may be filled in the pad recess 137 and a vertical channel pattern 220 and a channel pad 240 may be formed by performing a chemical mechanical polishing process. The vertical channel pattern 220 may have a hollow cylindrical or cup shape. A vertical structure 200 in which the blocking insulating pattern 211, the charge trap pattern 212, the tunnel insulating pattern 213, the vertical channel pattern 220, the filling insulating pattern 230 and the channel pad 240 are sequentially stacked may be formed on the sidewall of the channel hole 130. The channel pad 240 may include a conductive material such as doped polycrystalline silicon.

Figure 11:
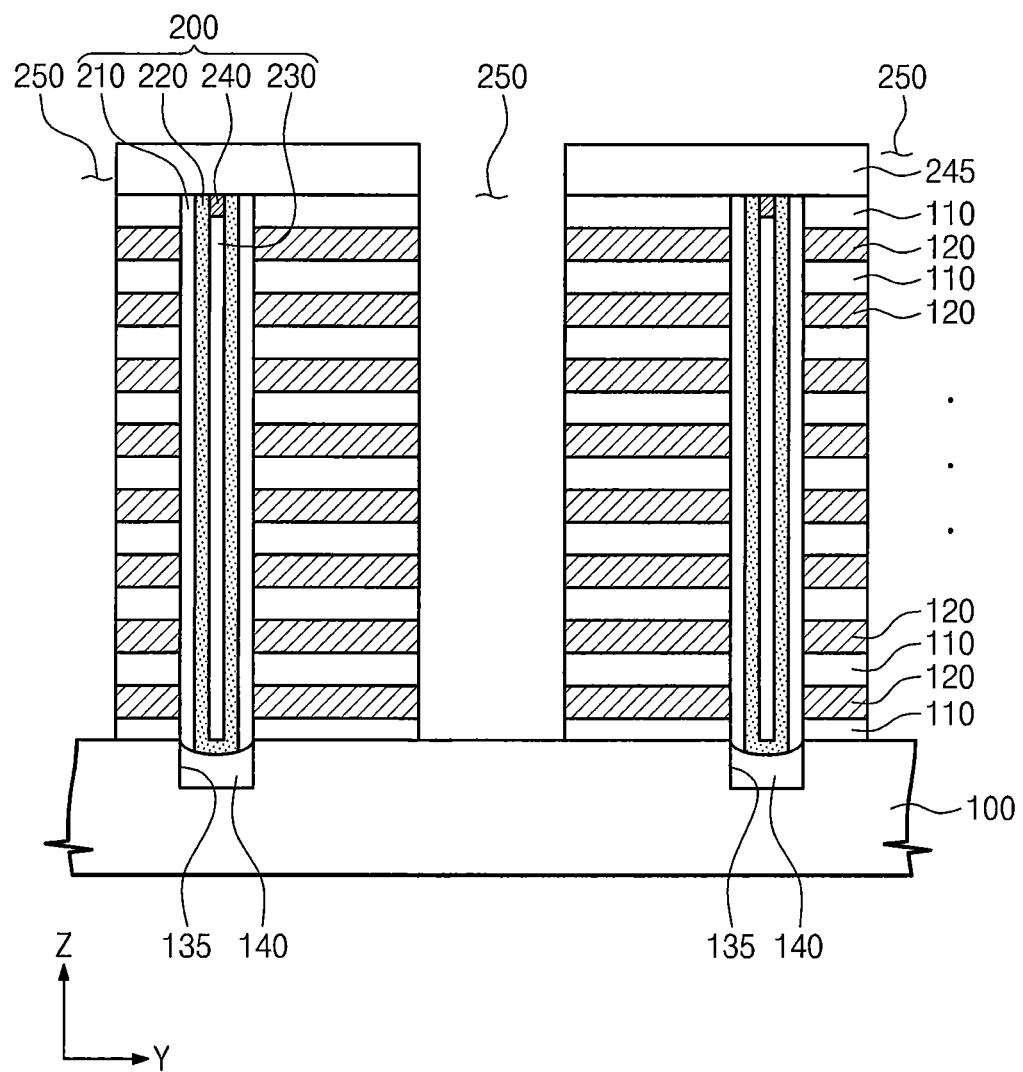

Referring to FIG. 11, a first capping insulating layer 245 may be formed, and a trench 250 may be formed by anisotropically etching the first capping insulating layer 245, the interlayer insulating layers 110 and the sacrificial layers 120 between the adjacent vertical channel structures 200. The trench 250 may expose the substrate 100 through the interlayer insulating layers 110 and the sacrificial layers 120 in a vertical manner. The trench 250 may extend along an X direction and have a linear shape. Side surfaces of the first capping insulating layer 245, the interlayer insulating layers 110 and the sacrificial layers 120 may be exposed on a sidewall of the trench 250.

Figure 12A:
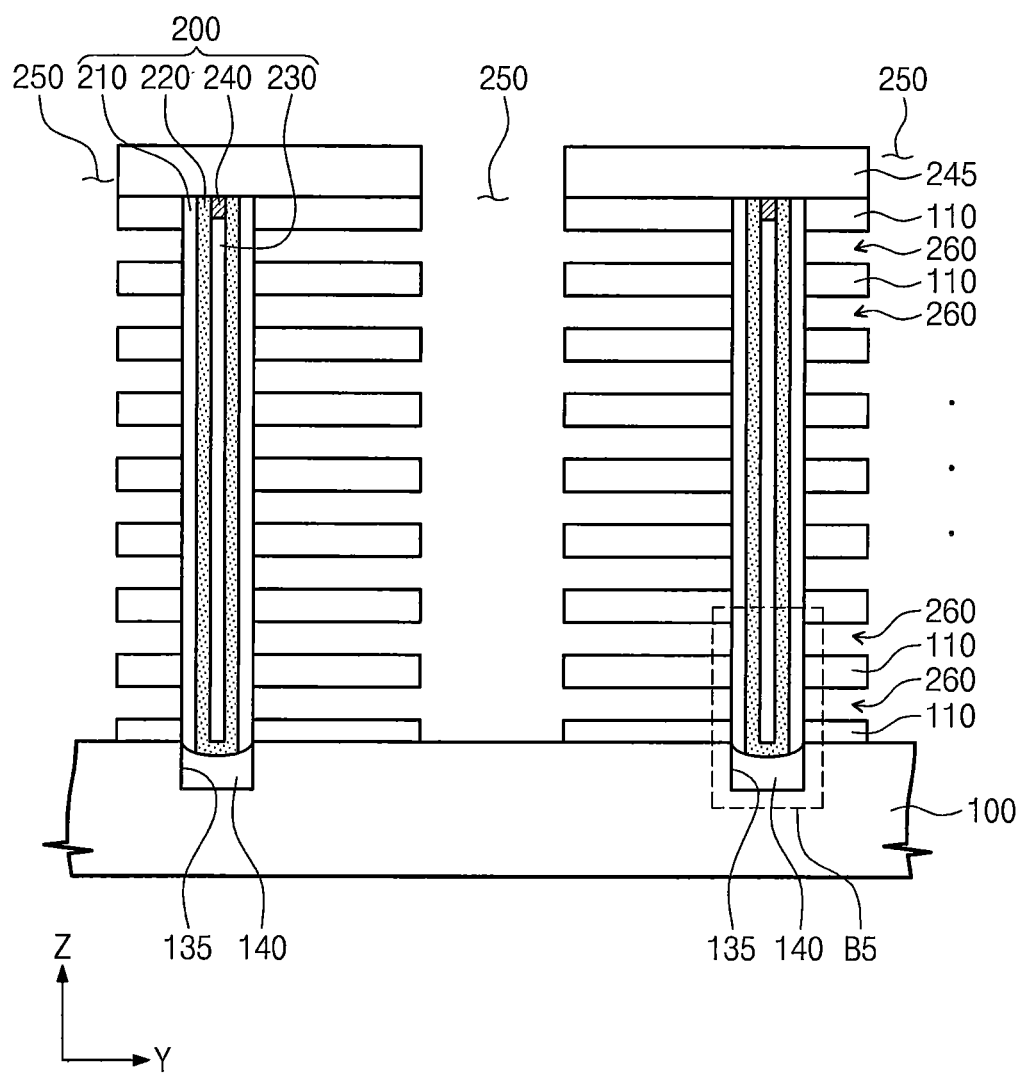
Figure 12B:
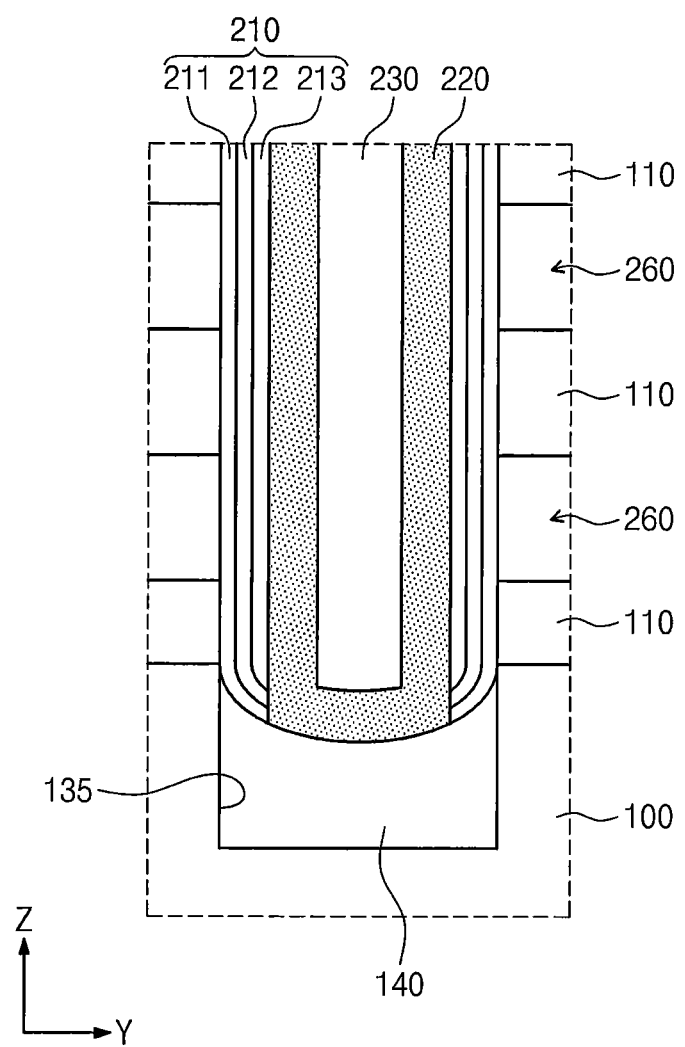

Referring to FIGS. 12A and 12B, gaps 260 between the interlayer insulating layers 110 may be formed by selectively removing the sacrificial layers 120 exposed on the sidewall of the trench 250. A portion of the blocking insulating pattern 211 may be exposed by the gaps 260.

The removal of the sacrificial layers 120 may include performing a wet etch process using an etchant having a higher etch selectivity than the interlayer insulating layers 110. When the interlayer insulating layer 110 and the sacrificial layer 120 include a silicon oxide layer and a silicon nitride layer, respectively, the etchant may include a phosphorus acid ($H_3PO_4$).

Figure 13A:
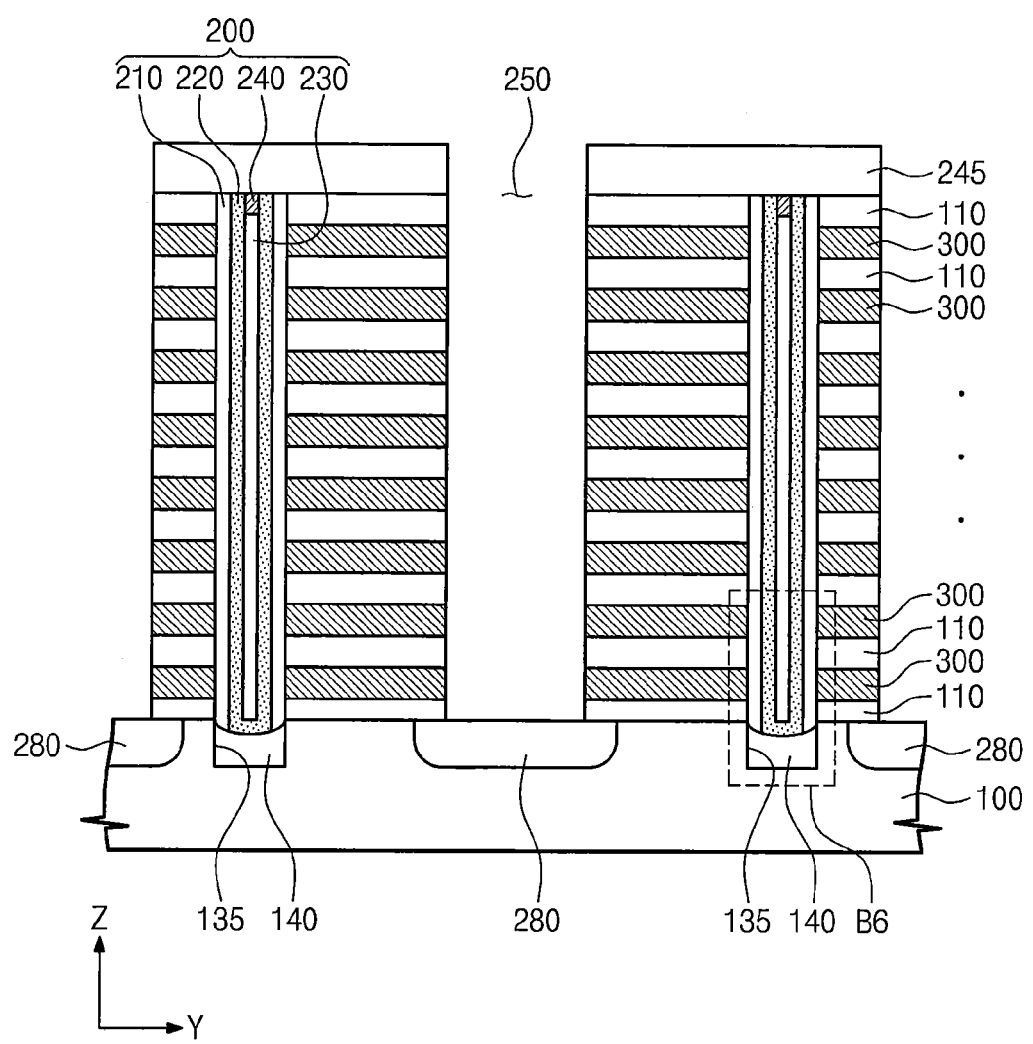
Figure 13B:
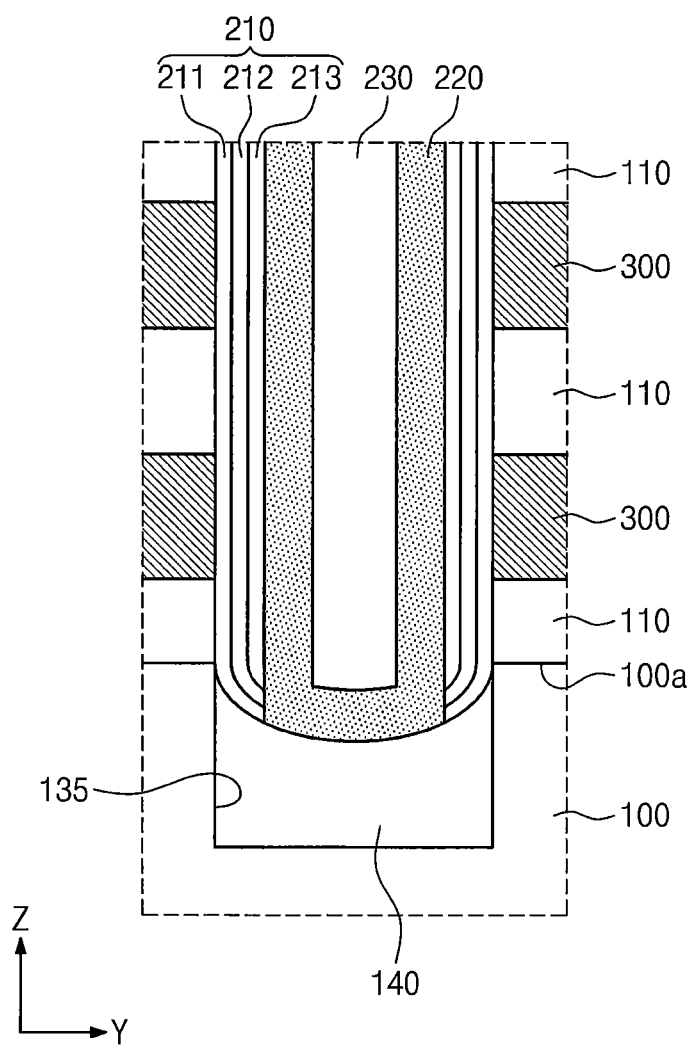

Referring to FIGS. 13A and 13B, gate electrodes 300 may be formed by fully filling a metal material in the gaps 260. The gate electrode 300 may further include a barrier metal layer formed on the inner wall of the gap 260. The barrier metal layer may include a metal nitride such as titanium, titanium nitride, tantalum and/or tantalum nitride. The metal material may include tungsten, titanium, tantalum, platinum or metal silicide. A high-k dielectric (for example, $Al_2O_3$) may further include between the gate electrode 300 and the inner wall of the gap 260.

Thereafter, impurities may be injected into the substrate 100 exposed in the trench 250. Thus, a common source region 280 may be formed extending in an X direction along the trench 250. The impurities may include N-type impurity such as phosphorus or arsenic.

Figure 14:
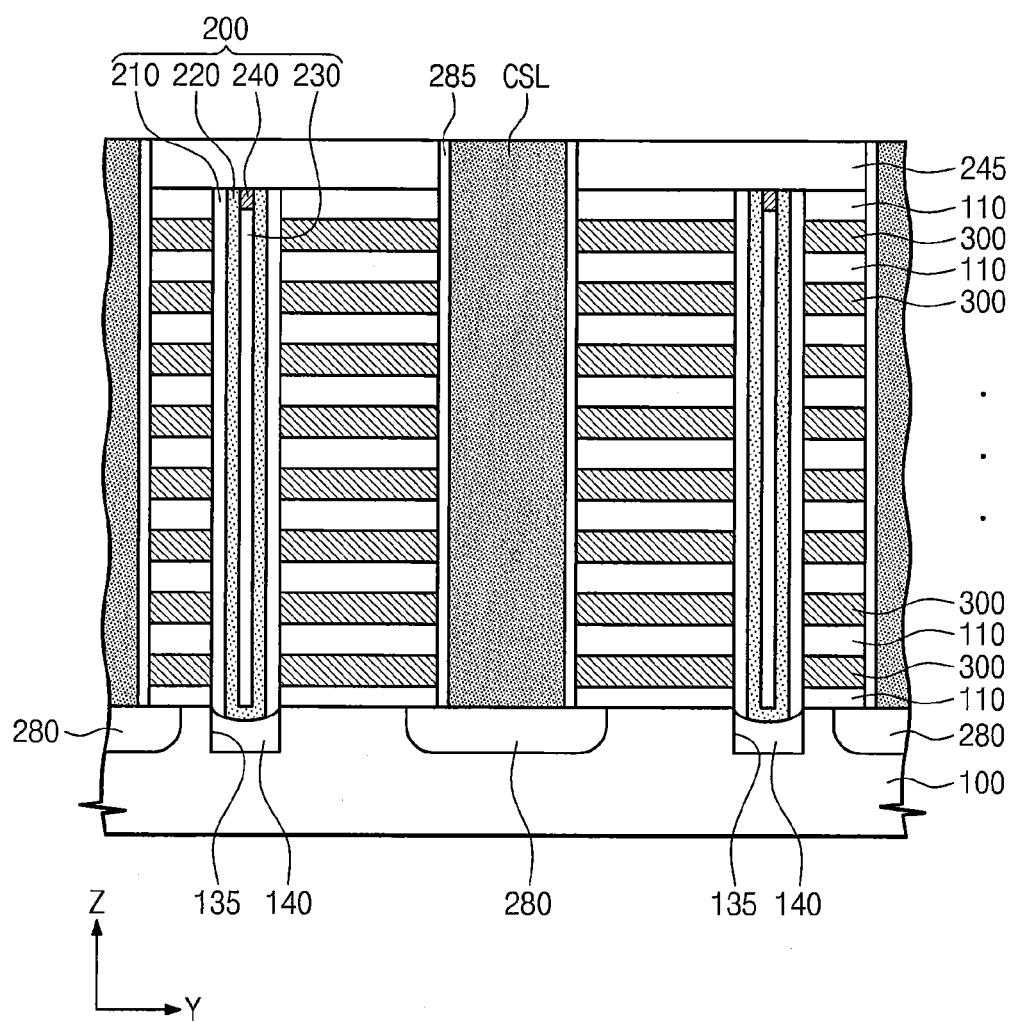

Referring to FIG. 14, a trench spacer 285 may be formed on the sidewall of the trench 250. Thereafter, a common source line CSL filling the trench 250 may be formed on the trench spacer 285 to extend in an X direction. The common source line CSL may be in direct contact with the common source region 280. Thus, the common source line CSL may be electrically connected to the common source region 280. The trench spacer 285 may electrically insulate the gate electrodes 300 from the common source line CSL. The trench spacer 285 may include an insulating material such as silicon oxide or silicon nitride. The common source line CSL may include a metal material such as tungsten, titanium, tantalum, platinum and a metal silicide.

Figure 15:
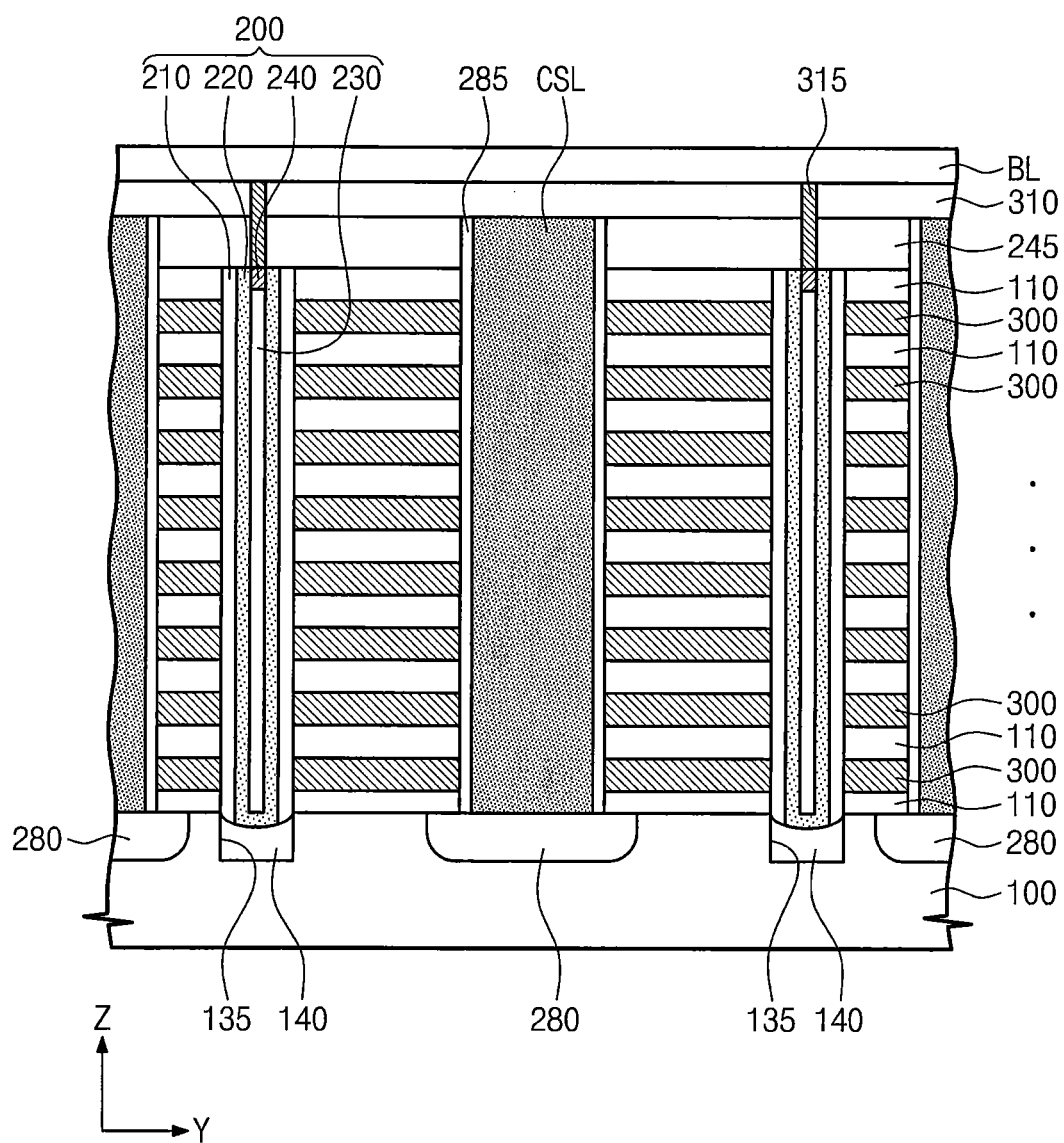

Referring to FIG. 15, a second capping insulating layer 310 may be formed on the first capping insulating layer 245 and the common source line CSL. Contact holes exposing an upper surface of the channel pad 240 may be formed in the first capping insulating layer 245 and the second capping insulating layer 310. Bit line contacts 315 may be formed in the contact holes. The bit line contact 315 may include a metal such as tungsten or cupper. Thereafter, a bit line BL in contact with an upper surface of the bit line contact 315 may be formed on the second capping insulating layer 310. The bit line BL may extend in a Y direction. The bit line BL may include a metal such as tungsten or copper.

According to example embodiments of the inventive concept, the upper surface 140a of the epitaxial pattern 140 may be positioned at lower level than the upper surface 100a of the substrate 100. Accordingly, a distance between the gate electrode 300 disposed the lowermost portion and the epitaxial pattern 140 may be increased, and it is possible to prevent a leakage current between the gate electrode 300 and the substrate 100 through the epitaxial pattern 140. As a result, electrical characteristics may be improved along with device reliability.

Figure 16:
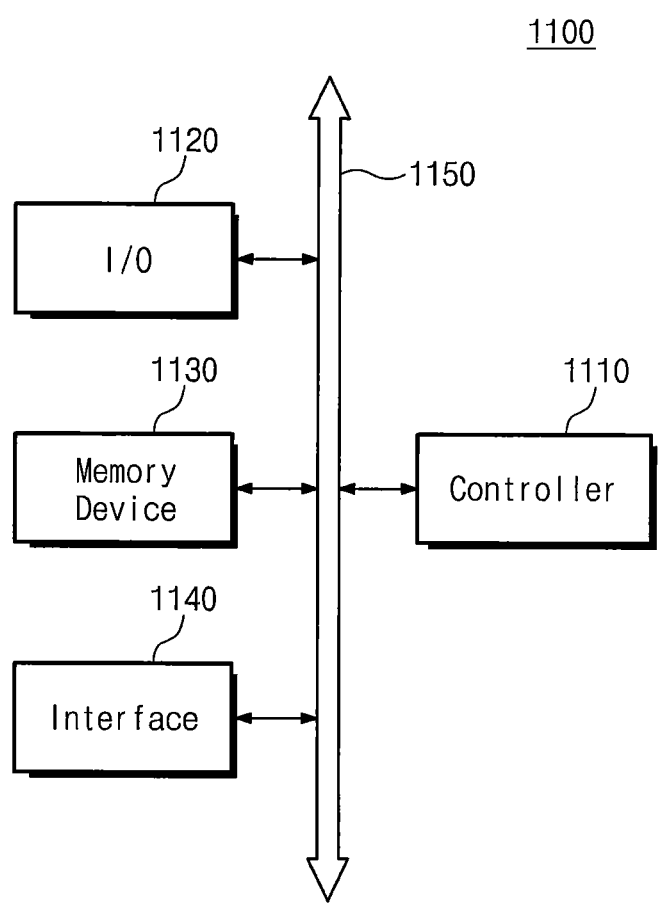
FIG. 16 is a block diagram illustrating an electronic system including a three dimensional semiconductor memory device according to some embodiments of the inventive concept.

Referring now to FIG. 16, a schematic block diagram illustrating an example of electric systems including three dimensional semiconductor memory devices according to embodiments of the inventive concept will be discussed. As illustrated in FIG. 16, the electric system 1100 according to embodiments of the inventive concepts may include a controller 1110, an input/output (I/O) device 1120, a memory device 1130, an interface unit 1140 and a data bus 1150. At least two of the controller 1110, the I/O device 1120, the memory device 1130 or the interface unit 1140 may communicate with each other through the data bus 1150. The bus 1150 is equivalent to path in which the data are moved.

The controller 1110 may include at least one of a microprocessor, a digital signal processor, microcontroller or other logic devices having a similar function thereof. The I/O device 1120 may include a keypad, a keyboard and a display unit. The memory device 1130 may store data and commands. The memory device 1130 may include a three dimensional semiconductor memory device according to some embodiments of the inventive concept. The memory device 1130 may further include at least one of a phase change memory device, a magnetic memory device, a dynamic random access memory (DRAM) device or a static random access memory (SRAM) device. The interface unit 1140 may transmit electrical data to a communication network, or may receive electrical data from the communication network. The interface unit 1140 may include an antenna or wired and wireless transceiver. Even though not shown in the drawings, the electric system 1100 may further include at least one of a high speed DRAM device or a high SRAM device that is used as an operation memory device to improve an operation of controller 1110.

The electric system 1100 may be applied to a personal digital assistant (FDA), a portable computer, a web tablet, a wireless phone, a mobile phone, a digital music player, memory card or any device capable of transmitting and/or receiving information in a wireless environment.

Figure 17:
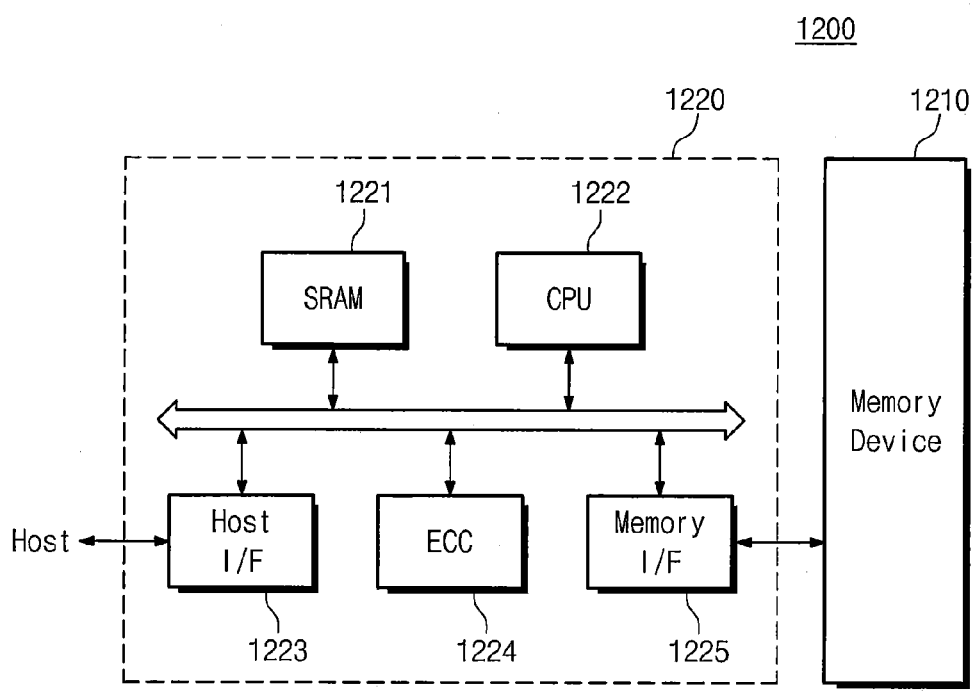
FIG. 17 is a block diagram illustrating a memory card including a three dimensional semiconductor memory device according to some embodiments of the inventive concept.

Referring now to FIG. 17, a schematic block diagram illustrating an example of a memory cards including three dimensional semiconductor memory devices according to embodiments of the inventive concept will be discussed. As illustrated in FIG. 17, the memory card 1200 may include a memory device 1210 according to embodiments of the inventive concepts. The memory device 1210 may include the three dimensional semiconductor memory device according to embodiments of the inventive concepts. The memory device 1210 may further include at least one of a phase change device, a magnetic memory device, a dynamic random access memory (DRAM) device or a static random access memory (SRAM) device. The memory card 1200 may include a memory controller 1220 that controls data communications between a host and the memory device 1210.

The memory controller 1220 may include a processing unit 1222 that controls overall operations of the memory card 1200. In addition, the memory controller 1220 may include a static random access memory (SRAM) device 1221 that is used as an operation memory of the processing unit 1222. The memory controller 1220 may further include a host interface unit 1223 and a memory interface unit 1225. The host interface unit 1223 may be configured to include a data communication protocol between the memory card 1200 and a host. The memory interface unit 1225 may connect memory controller 1220 with the memory device 1210. The memory controller 1220 may further include an error check and correction block (ECC) 1224. The error check and correction block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. In contrast, the memory card 1200 may be realized as a solid state disk (SSD) that is able to replace a hard disk drive of computer system.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A semiconductor memory device, comprising:
a substrate;
a plurality of interlayer insulating layers and gate electrodes alternately stacked on the substrate, the plurality of interlayer insulating layers and the gate electrodes defining a channel hole that vertically penetrates the plurality of interlayer insulating layers and the gate electrodes to expose at least a portion of the substrate;
a channel recess in the substrate exposed by the channel hole; and
an epitaxial pattern filling the channel recess, wherein the epitaxial pattern has an upper surface that is concave and curves inward in a middle portion thereof.

2. The device of claim 1, wherein the upper surface of the epitaxial pattern includes an edge in contact with a sidewall of the channel recess, wherein the edge is positioned at a level substantially equivalent to an upper surface of the substrate.

3. The device of claim 1, wherein the epitaxial pattern includes a same material as the substrate.

4. The device of claim 1, wherein the epitaxial pattern is doped with impurities of a same conductivity type as the substrate.

5. The device of claim 1, further comprising a vertical channel pattern disposed in the channel hole, wherein the vertical channel pattern is electrically connected to the epitaxial pattern.

6. The device of claim 5, wherein the vertical channel pattern directly contacts the epitaxial pattern.

7. The device of claim 5, wherein a bottom surface of the vertical channel pattern is positioned at a lower level than an upper surface of the substrate.

8. The device of claim 5, further comprising a gate dielectric pattern surrounding an outside sidewall of the vertical channel pattern.

9. The device of claim 8, wherein the gate dielectric pattern has a pipe shape.

10. The device of claim 8, wherein the gate dielectric pattern includes a blocking insulating pattern, a charge trap pattern and a tunnel insulating pattern.

11. The device of claim 8, wherein a bottom surface of the gate dielectric pattern is positioned at a level between an upper surface of the substrate and a bottom surface of the vertical channel pattern, wherein the upper surface of the substrate is positioned at a higher level than the bottom surface of the vertical channel pattern.

12. The device of claim 5, further comprising a filling insulating pattern filling an inner space of the vertical channel pattern.

13. The device of claim 12, further comprising a horizontal boundary between the filling insulating pattern and the vertical channel pattern and is positioned at a lower level than an upper surface of the substrate.

14. A semiconductor memory device, comprising:
a substrate including an epitaxial pattern;
a plurality of gate electrodes vertically stacked on the substrate;
a vertical channel pattern penetrating the plurality of gate electrodes and electrically connected to the epitaxial pattern; and
a gate dielectric pattern between the vertical channel pattern and the gate electrodes and surrounding a sidewall of the vertical channel pattern,
wherein the epitaxial pattern has a upper surface having a center portion that is positioned at a lower level than an edge thereof;
wherein the gate dielectric pattern has a bottom surface between the edge of the epitaxial pattern and the vertical channel pattern; and
wherein the bottom surface of the gate dielectric pattern is positioned at a lower level than a upper surface of the substrate.

15. The device of claim 14, wherein the epitaxial pattern includes a same material as the substrate.

16. The device of claim 14, wherein the epitaxial pattern is doped with impurities of a same conductivity type as the substrate.

17. The device of claim 14, wherein the gate dielectric pattern includes a blocking insulating pattern, a charge trap pattern and a tunnel insulating pattern.

18. The device of claim 14, wherein the gate dielectric pattern has a pipe shape.

19. The device of claim 14, wherein the bottom surface of gate dielectric pattern is positioned at a higher level than a bottom surface of the vertical channel pattern.

20. A semiconductor memory device, comprising:
a plurality of gate electrodes vertically stacked on the substrate;
a vertical channel pattern penetrating the gate electrodes and electrically connected to an epitaxial pattern; and
a filling insulating pattern filling an inner space of the vertical channel pattern,
wherein a horizontal boundary between the vertical channel pattern and the filling insulating pattern is positioned at a lower level than the upper surface of the substrate.

* * * * *